US 6,700,146 B2

United States Patent
Ito

(10) Patent No.: US 6,700,146 B2
(45) Date of Patent: Mar. 2, 2004

(54) SEMICONDUCTOR MEMORY DEVICE AND METHOD FOR PRODUCING THE SAME

(75) Inventor: Yasuyuki Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/351,666

(22) Filed: Jan. 27, 2003

(65) Prior Publication Data

US 2003/0141528 A1 Jul. 31, 2003

(30) Foreign Application Priority Data

Jan. 31, 2002 (JP) ........................ 2002-024065

(51) Int. Cl.[7] ............... H01L 27/108; H01L 31/119; H01L 29/76; H01L 29/94
(52) U.S. Cl. .................. 257/295; 257/296; 257/306
(58) Field of Search ................. 257/295–310; 438/253–254, 396–398, 3

(56) References Cited

U.S. PATENT DOCUMENTS 6,300,654 B1 * 10/2001 Corvasce et al. ........... 257/296
6,566,698 B2 * 5/2003 Nishihara et al. .......... 257/295

* cited by examiner

Primary Examiner—Cuong Nguyen
(74) Attorney, Agent, or Firm—Robert J. Depke; Holland & Knight LLP

(57) ABSTRACT

A semiconductor memory device able to increase the effective area of a capacitor in a memory cell and ensure a sufficient amount of charge contained in a read signal while maintaining the smallest cell area and a method for producing the same, wherein a first node electrode, a first ferroelectric film, and plate electrodes form four ferroelectric capacitors, plate electrodes, a second ferroelectric film, and a second node electrode form other four ferroelectric capacitors, the first node electrode is electrically connected to the second node electrode, a capacitor below a plate electrode is connected in parallel with the capacitor above the plate electrode, and these two capacitors connected in parallel form a memory cell storing 1 bit of data.

8 Claims, 15 Drawing Sheets

SEMICONDUCTOR MEMORY DEVICE AND
METHOD FOR PRODUCING THE SAME

This application claims priority to Japanese Patent Application Number JP2002-024065 filed Jan. 31, 2002, which is incorporated herein by reference.

BACKGROUND OF THE INVENTION

1. Field of the Invention

The present invention relates to a semiconductor memory device having ferroelectric capacitors, particularly to a semiconductor memory device able to be made highly integrated and to have a large capacity, and a method for producing the same.

2. Description of the Related Art

Recently many studies have been made for nonvolatile memory devices that make use of ferroelectric materials exhibiting the unique electrical characteristic called "spontaneous polarization" (ferroelectric memory devices or ferroelectric random access memories (FeRAMs), see U.S. Pat. No. 4,873,664) because of their high write speed, high read speed, low operation voltage, and other features. These have the possibility of replacing not only usual nonvolatile memories, but also static random access memories (SRAMs), direct random access memories (DRAMs), and most other types of memories.

In memory devices utilizing the spontaneous polarization characteristic of ferroelectric materials, wide use is made of a type of memory cell having a select transistor in addition to a ferroelectric capacitor, that is, a memory cell having a structure of one transistor and one capacitor (1 Transistor/1 Capacitor, or just abbreviated as "1T1C"). This type of FeRAM is obtained by just replacing a paraelectric capacitor material in a usual DRAM memory cell by a ferroelectric material.

Various materials have been developed for use as ferroelectic materials, such as lead-based oxides of an $ABO_3$ type Perovskite crystal structure like $Pb(Zr,Ti)O_3$ (PZT) or $(Pb,La)(Zr,Ti)O_3$ (PLZT), and bismuth-layered compounds like $SrBi_2Ta_2O_9$ (SBT). Particularly, SBT exhibits a superior fatigue property of not degrading even after repeated polarization switching and a superior polarization saturation property of a low electric field causing polarization saturation, and thus is useful for reducing the operation voltage.

To replace DRAMs and to be used widely, it is necessary for FeRAMs to have a degree of integration and a storage capacity comparable with those of DRAMs. However, it has been difficult to increase the degree of integration of FeRAMs having the aforesaid 1T1C type memory cell structure.

For a higher degree of integration, it is necessary to decrease the area of the memory cell. A memory cell is a region for storing 1 bit of data in a memory. Theoretically, the minimum value of the area of a memory area is that occupied by a predetermined number of word lines and bit lines intersecting each other in this region when arranged at shortest intervals. For an FeRAM of the 1T1C structure, usually there are 1 word line and 2 bit lines for 1 bit. When these word line and bit lines are arranged at shortest intervals, if the minimum design rule in semiconductor processing is F, the theoretical minimum cell area of the above FeRAM is $8F^2$, the same as a DRAM.

Actually, in each 1-bit storage area in a FeRAM, there are two transistors and two ferroelectric capacitors. Further, in addition to word lines and bit lines, plate lines have to be provided. Therefore, it is impossible to arrange the word lines and bit lines at shortest intervals and so the real cell area is larger than $8F^2$.

On the other hand, a flash memory, which is also a semiconductor nonvolatile memory, has a minimum cell area as small as $4F^2$ because there is only one transistor in its memory cell.

In order to realize a higher degree of integration and a larger storage capacity for FeRAMs, memory cells each consisting of one element such as in a flash memory have been developed in recent years.

For example, in the FeRAMs disclosed by Japanese Unexamined Patent Publication (Kokai) No. 9-116107 (referred to as Reference 1 hereinafter) and in Japanese Unexamined Patent Publication (Kokai) No. 2000-349248 (referred to as Reference 2 hereinafter), a plurality of ferroelectric capacitors are connected to a common node electrode that is connected to a bit line through a select transistor, and each ferroelectric capacitor acts as a memory cell storing 1 bit of data. That is, a ferroelectric memory of a one-capacitor (1C) structure is realized, so theoretically it is possible to obtain a minimum cell area of $4F^2$, the same as a flash memory.

Further, as proposed in Japanese Patent Application No. 2000-156089 (referred to as Reference 3 hereinafter), further integration is possible for a ferroelectric memory having not less than two stacked layers of the aforesaid 1C structure obtained by forming a plurality of ferroelectric capacitors on a common node electrode. For example, theoretically, the minimum cell area can be as small as $2F^2$ to $4F^2$.

Since the actual cell area is determined by the minimum design rule F of semiconductor devices, so far, the reduction in the minimum design rule F along with progress in photolithography and other microprocessing technology has been the most important means of increasing the degree of integration of integrated circuits.

However, as the degree of integration becomes higher and the minimum design rule for designing elements becomes smaller, the area of the ferroelectric capacitor will also become smaller and the capacitance of and the amount of charge stored in the ferroelectric capacitor will become smaller. As a result, the signal picked up by a sense amplifier will not be large enough, causing malfunction of the memory. This has been a problem in DRAMs, which have the same structure as FeRAMs, and therefore will also be a problem for FeRAMs for which higher integration is sought.

Usually, the method used to solve this problem was to give the lower electrode of the capacitor a three-dimensional structure. In case of the already high integrated DRAMs, for example, in the DRAM memory cell disclosed in Japanese Unexamined Patent Publication (Kokai) No. 6-29482 (referred to as Reference 4 hereinafter), capacitors were stacked in a three-dimensional structure to make the surface area of the capacitors as large as possible.

Summarizing the problem to be solved by the invention, however, in case of a FeRAM including crystalline thin films composed of several kinds of elements, it is difficult to form a uniform thin film on a lower electrode having a three-dimensional structure, thus practical use has not been achieved yet.

So far, development has focused on methods applicable to FeRAMs for increasing the capacitance of a capacitor while satisfying the requirement of a higher degree of integration. The idea is the same as that for DRAMs, for example, increasing the effective area of a capacitor in a ferroelectric memory of a 1T1C structure by giving it a three-dimensional structure.

For example, in the ferroelectric memory cell of the 1T1C structure disclosed in Japanese Unexamined Patent Publication (Kokai) No. 7-86528 (referred to as Reference 5 hereinafter), giving the ferroelectric capacitor a multi-layer capacitor structure makes it possible to increase the capacitor area equivalently without increasing the area actually occupied by the capacitor and to secure a stable amount of charge contained in a signal.

Further, in the ferroelectric memory cell of the 1T1C structure disclosed in Japanese Unexamined Patent Publication (Kokai) No. 10-242410 (referred to as Reference 6 hereinafter), by providing a first capacitor and a second capacitor above and below a select transistor, it becomes possible to increase the overall area of the capacitor in a memory cell without increasing the area of the memory cell.

However, because the ferroelectric memory cells disclosed in Reference 5 and Reference 6 have 1T1C structures, the cell area itself is large, so it is difficult to achieve a high degree of integration. Further, in References 1, 2, and 3, which disclose memory cells of a smallest cell area, methods are not disclosed for increasing the effective area of a capacitor in a ferroelectric memory of a 1C structure.

SUMMARY OF THE INVENTION

An object of the present invention is to provide a semiconductor memory device able to increase the effective area of a capacitor in a memory cell and ensure a sufficient amount of charge contained in a read signal while maintaining the smallest cell area, and a method for producing the same.

To attain the above object, according to a first aspect of the present invention, there is provided a semiconductor memory device comprising a MIS transistor for selecting a memory cell, a common node electrode electrically connected with an impurity diffusing region of the MIS transistor; a bit line electrically connected with another impurity diffusing region of the MIS transistor, and a plurality of storage means connected to the common node electrode, wherein each storage means includes a plurality of capacitors electrically connected with each other in parallel.

Preferably, in the above semiconductor memory device, the plurality of storage means are formed by stacking a plurality of capacitor layers each including the common node electrode, a plate electrode layer having a plurality of plate electrodes each facing the common node electrode, and a dielectric film between the common node electrode and the plate electrode layer, where, in two adjacent capacitor layers, the common node electrode, the dielectric film, and the plate electrode layer are arranged in reverse order.

To attain the above object, according to a second aspect of the present invention, there is provided a semiconductor memory device comprising a plurality of memory cell blocks each including a MIS transistor for selecting a memory cell, a common node electrode electrically connected with an impurity diffusing region of the MIS transistor, a bit line electrically connected with another impurity diffusing region of the MIS transistor, and a plurality of storage means connected to the common node electrode, wherein each storage means includes a plurality of capacitors electrically connected with each other in parallel, and the common node electrodes of different memory cell blocks are stacked so as to overlap each other.

Preferably, in each memory cell block in the above semiconductor memory device, the plurality of storage means are formed by stacking a plurality of capacitor layers each including the common node electrode, a plate electrode layer having a plurality of plate electrodes each facing the common node electrode, and a dielectric film between the common node electrode and the plate electrode layer, where in two adjacent capacitor layers, the common node electrode, the dielectric film, and the plate electrode layer are arranged in reverse order.

To attain the above object, according to a third aspect of the present invention, there is provided a method for producing a semiconductor memory device comprising a MIS transistor for selecting a memory cell, N (N is a natural number, N>1) number of storage means connected with an impurity diffusing region of the MIS transistor, and a bit line electrically connected with another impurity diffusing region of the MIS transistor, wherein each storage means includes M (M is a natural number, M>1) number of capacitors electrically connected with each other in parallel, comprising a step of forming the MIS transistor on a semiconductor substrate, a step of forming a contact plug having a first conductivity extending to an impurity diffusing region of the MIS transistor and a contact plug having a second conductivity extending to another impurity diffusing region of the MIS transistor in an insulating film covering the semiconductor substrate formed with the MIS transistor, a storage means forming step for forming the N number of storage means connected to the contact plug having the first conductivity, and a step of forming the bit line connected to the contact plug having the second conductivity.

Preferably, in the above method, the storage means forming step includes a step of forming a first common node electrode connecting with the contact plug having the first conductivity, a first step of forming a first dielectric film on the first common node electrode, a second step of forming a first plate electrode layer having N number of plate electrodes on the first dielectric film, a third step of forming a second dielectric film on the first plate electrode layer, a fourth step of forming a second common node electrode connecting with the first common node electrode on the second dielectric film, and a fifth step of further repeating the first step, the second step, the third step, and the fourth step for (M/2-1) times using the second common node electrode formed in the fourth step as the first common node electrode formed in the first step when M is an even number greater than 2, or further repeating the first step, the second step, the third step, and the fourth step for ((M-1)/2-1) times and further performing the first step and the second step using the second common node electrode formed in the fourth step as the first common node electrode formed in the first step when M is an odd number.

To attain the above object, according to a fourth aspect of the present invention, there is provided a method for producing a semiconductor memory device comprising a plurality of memory cell blocks each including a MIS transistor for selecting a memory cell, N (N is a natural number, N>1) number of storage means connected with an impurity diffusing region of the MIS transistor, and a bit line electrically connected with another impurity diffusing region of the MIS transistor, wherein each storage means includes M (M is a natural number, M>1) number of capacitors electrically connected with each other in parallel, and the N numbers of storage means of different memory cell blocks are stacked so as to overlap each other, comprising a step of forming a plurality of the MIS transistors on a semiconductor substrate, a step of forming a contact plug having a first conductivity extending to an impurity diffusing region of the MIS transistor and a contact plug having a second conductivity extending to another impurity diffusing region of the MIS transistor in an insulating film covering the semiconductor substrate formed with each MIS transistor, a storage means forming step for forming the N number of storage means connected to each contact plug having the first conductivity, and a step of forming the bit line connected to each contact plug having the second conductivity, wherein the N numbers of storage means connected to different memory cell blocks are formed to overlap each other.

According to the present invention, when forming memory cells by folding back at least once a memory cell block in which a plurality of ferroelectric capacitors are formed on a common node electrode and each capacitor acts as a memory cell, that is, has the so-called 1C structure, each memory cell becomes a stacked multi-layer structure. Due to this, the effective area of each capacitor is increased by 2 times or more without increasing the area of the storage region for a bit. Furthermore, by overlapping different capacitors each having a stacked multi-layer structure with each other, further integration is achievable.

BRIEF DESCRIPTION OF THE DRAWINGS

The above object and features of the present invention will become more apparent from the following detailed explanation given with reference to the accompanying drawings, in which.

DESCRIPTION OF THE PREFERRED EMBODIMENTS

Figure 1:
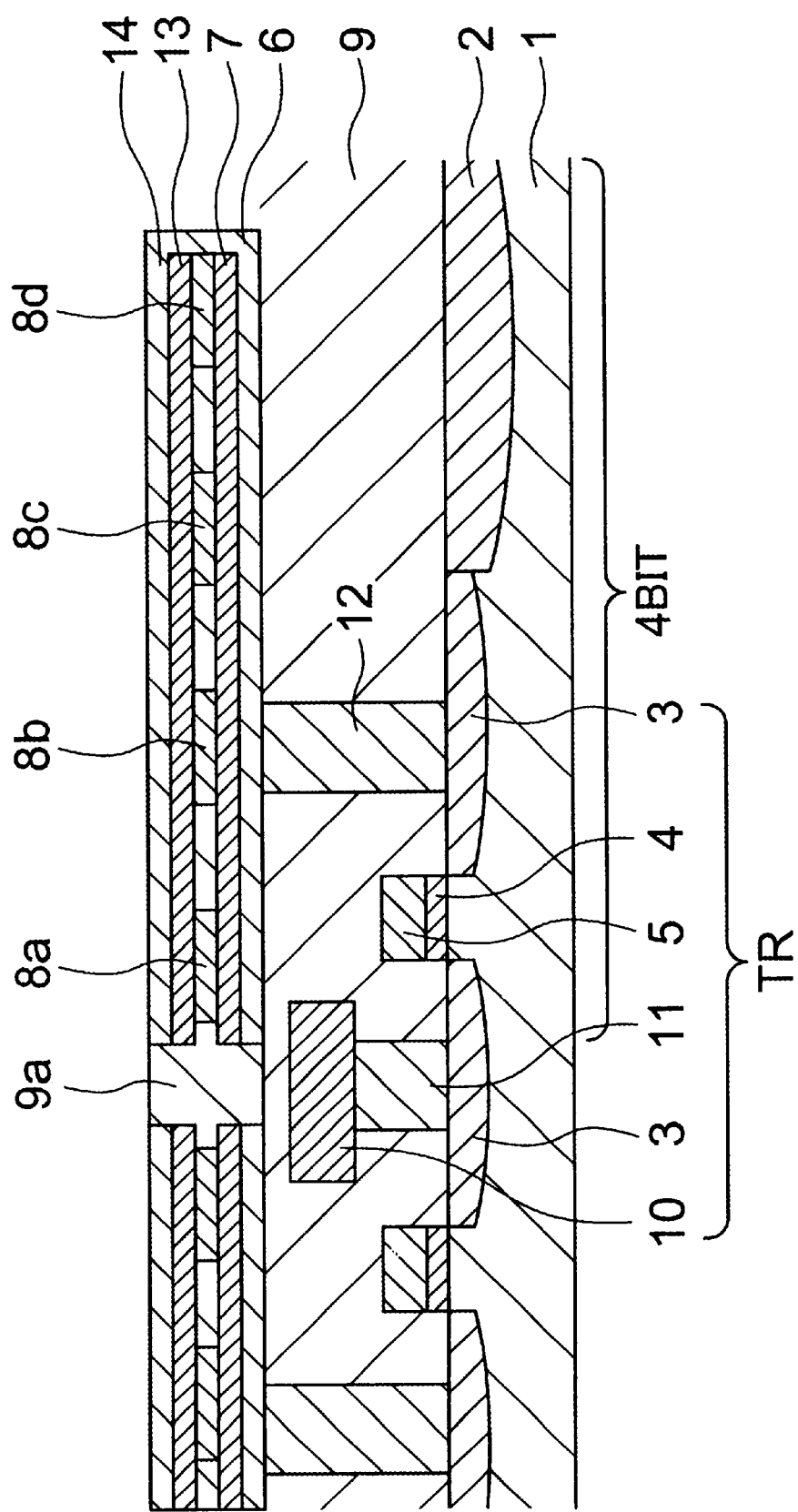
FIG. 1 is a sectional view of an example of the configuration of a semiconductor memory device according to a first embodiment of the present invention.

Below, an explanation will be made of preferred embodiments of a semiconductor memory device of the present invention and a method for producing the same by referring to the accompanying drawing. In the following embodiments, the same reference numerals are assigned to the same or the corresponding configurations in different figures.

First Embodiment

FIG. 1 is a partial sectional view of the configuration of a ferroelectric memory given as an example of a semiconductor memory device according to the present embodiment.

The ferroelectric memory shown in FIG. 1 includes a semiconductor substrate 1, an element separation region 2, a drain source region 3, a gate insulating film 4, a gate electrode (word line) 5, a first node electrode 6 serving as a common lower electrode of four ferroelectric capacitors, a first ferroelectric film 7, plate electrodes 8a, 8b, 8c, and 8d forming plate lines PL1, PL2, PL3, and PL4, interlayer insulating films 9, 9a, a bit line 10 (BL1), contact plugs 11, 12, a second ferroelectric film 13, and a second node electrode 14.

The gate electrode 5, for example, is formed by polysilicon or polycide, while the contact plug 12 and the bit line 10 are formed by by polysilicon and aluminum, respectively.

The first node electrode 6, the second node electrode 14, and the plate electrodes 8a, 8b, 8c, and 8d, preferably include at least one of Pt, Ir, Ru, Rh, Re, Os, and Pd of the noble metal family, which are low in electrical resistance, high in thermal tolerance, and low in reactivity. Alternatively, as the node electrodes and the plate electrodes, use can be made of oxides of the above noble metals, because they are superior in diffusion barrier ability, able to prevent loss of oxygen in a ferroelectric, and are conductive.

Here, for example, a 150 nm thick Ir film is used for the first node electrode 6, while 100 nm thick Ir films are used for the second node electrode 14 and the plate electrodes 8a, 8b, 8c, and 8d.

As the ferroelectric materials in ferroelectric nonvolatile memories, use can be made of ones having an $ABO_3$ type Perovskite crystal structure such as $SrTiO_3$, $(Ba,Sr)TiO_3$, $Pb(Zr,Ti)O_3$, $(Pb,La)(Zr,Ti)O_3$, $PbTiO_3$, $BaTiO_3$, $LiNbO_3$, $LiTaO_3$, or $YMnO_3$, or ones including bismuth-layered compounds of a Perovskite crystal structure such as $SrBi_2Ta_2O_9$, $SrBi_2Nb_2O_9$, $SrBi_2(Ta,Nb)_2O_9$, $Bi_4Ti_3O_{12}$, $SrBi_4Ti_4O_{15}$, $SrBi_4(Ti, Zr)_4O_{15}$, $Bi_3TiNbO_9$, $Bi_3TiTaO_9$, $BaBi_2Ta_2O_9$, and $BaBi_2Nb_2O_9$.

Here, as an example, a 100 nm thick SBT film ($SrBi_2Ta_2O_9$) is used for the first ferroelectric film 7 and the second ferroelectric film 13.

As shown in FIG. 1, the first ferroelectric film 7 is formed on the first node electrode 6, plate electrodes 8a, 8b, 8c, and 8d are formed at predetermined intervals on the first ferroelectric film 7, the second ferroelectric film 13 is formed on the plate electrodes 8a, 8b, 8c, and 8d, and the second node electrode 14 is formed on the second ferroelectric film 13.

The first node electrode 6 is connected to the drain source region 3 through the contact plug 12 and is further connected to the bit line BL1 through the transistor TR and the contact plug 11.

The first node electrode 6 is electrically connected to the second node electrode 14.

In FIG. 1, the first node electrode 6, the first ferroelectric film 7, and the plate electrodes 8a, 8b, 8c, and 8d form four ferroelectric capacitors, while the plate electrodes 8a, 8b, 8c, and 8d, the second ferroelectric film 13, and the second node electrode 14 form other four ferroelectric capacitors.

Since the first node electrode 6 is electrically connected to the second node electrode 14, a capacitor below a plate electrode is connected in parallel with the capacitor above the plate electrode In the present embodiment, such a pair of capacitors connected in parallel form a memory cell storing 1 bit of data. FIG. 1 shows a memory cell block including four pairs of such capacitors, therefore four memory cells storing a maximum of 4 bits of data. These cells are connected to the bit line BL1 through the contact plug 12, transistor TR, and the contact plug 11.

In the related art, a memory cell block equivalent to the structure including the first node electrode 6, the first ferroelectric film 7, and the plate electrodes. 8a, 8b, 8c, and 8d of the present embodiment is disclosed. Such a memory cell block also has four capacitors each storing 1 bit of data. In other words, the memory cell block of the present embodiment shown in FIG. 1 is formed by upwards folding back once the memory cell block of the related art.

As a result, in the present embodiment, the effective area of the capacitor in each memory cell is increased two-fold without increasing the area of a planar region storing 1 bit of data (memory cell) on the semiconductor substrate compared with the cell area in a memory device of the related art. Due to this, the capacitance of and the charge stored in the capacitor in each memory cell are also increased two-fold compared with the related art, and the charge contained in a signal obtained by a sense amplifier rises too.

Figure 2:
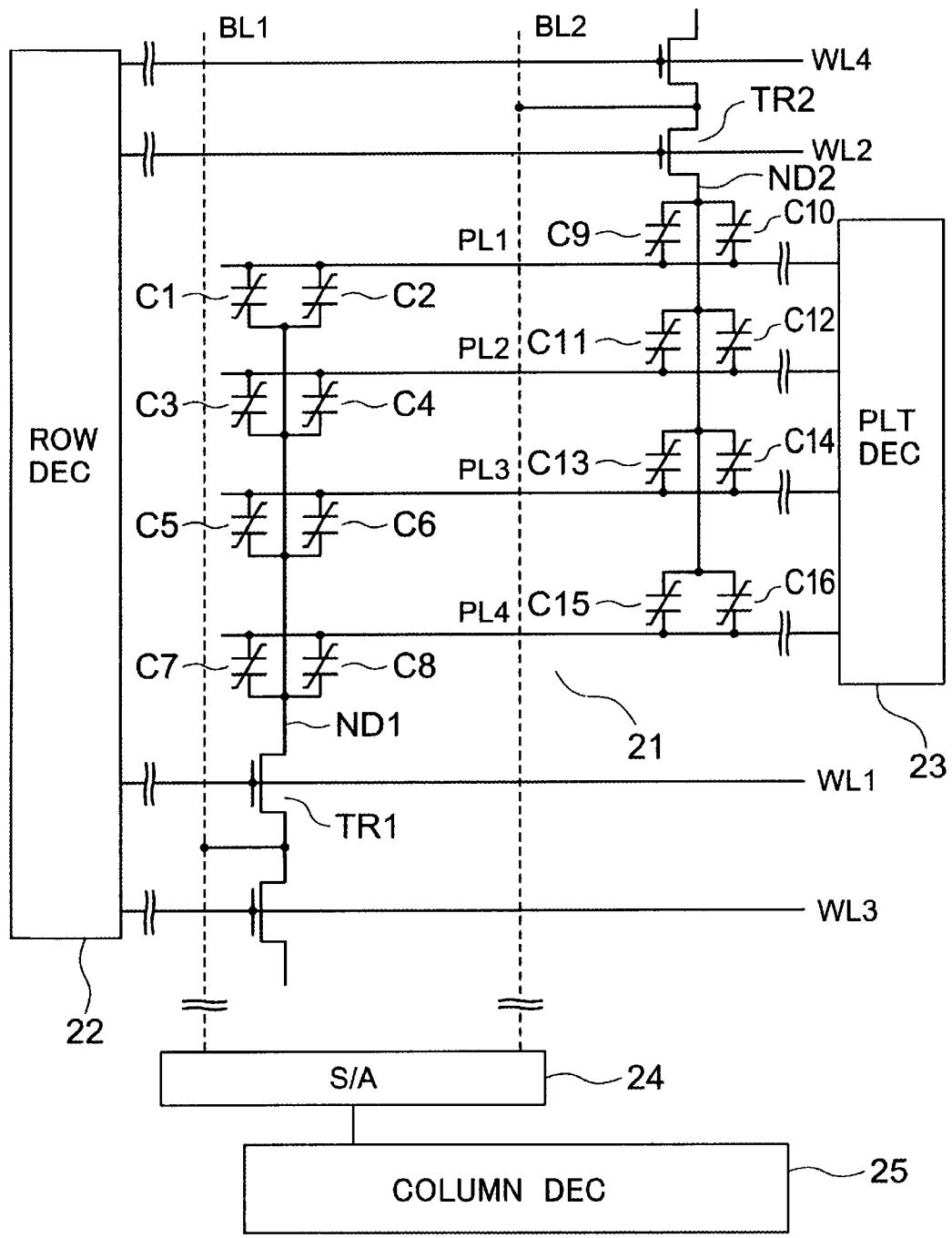
FIG. 2 is an equivalent circuit of an example of a semiconductor memory device according to the first embodiment of the present invention.

FIG. 2 shows an example of an equivalent circuit of a ferroelectric memory formed by the memory cell block shown in FIG. 1.

The ferroelectric memory shown in FIG. 2 includes a memory cell array 21, a row decoder 22, a plate decoder 23, a sense amplifier (S/A) 24, and a column decoder 25.

In memory cell array 21, a plurality of memory cells (eight memory cells in FIG. 2) each having two ferroelectric capacitors connected in parallel are arranged in a matrix.

The two ferroelectric capacitors connected in parallel in each memory cell (indicated by C1 and C2, C3 and C4, C5 and C6, C7 and C8, C9 and C10, C11 and C12, C13 and C14, or C15 and C16) correspond to the stacked two capacitors in each memory cell described above.

Hereinafter, the memory cells formed by the two ferroelectric capacitors connected in parallel are indicated by C1+C2, C3+C4, C5+C6, C7+C8, C9+C10, C11+C12, C13+C14, and C15+C16, respectively.

Note that, for sake of simplicity, only two memory cell blocks each having four memory cells are shown in FIG. 2, but it is apparent that such memory cell blocks are repeatedly arranged in practice.

In FIG. 2, in the memory cells C1+C2, C3+C4, C5+C6, and C7+C8 which are arranged in the same column, one electrode of each capacitor is connected to a node electrode ND1 and is connected to the bit line BL1 through an n-channel MOS transistor TR1 arranged in the same column. The other electrodes of all the above capacitors are connected to the plate line PL1, PL2, PL3, and PL4, respectively, enabling independent read and write operations relative to the memory cells C1+C2, C3+C4, C5+C6, and C7+C8.

Similarly, the columns of the memory cells C9+C10, C11+C12, C13+C14, and C15+C16 are connected to a node electrode ND2 and a transistor TR2.

The gate electrode of the transistor TR1 is connected to a word line WL1, and the gate electrode of the transistor TR2 is connected to a word line WL2.

The row decoder 22 supplies a predetermined power voltage Vcc+α (α represents a voltage higher than the threshold voltage of transistor TR1 or TR2) to a word line (word line WL1 or WL2 in FIG. 2) designated in address and keeps the transistor TR1 or TR2 on.

The plate decoder 23 supplies a predetermined voltage of 0V or Vcc to a plate line PL1, PL2, PL3, or PL4 designated in address during data access so as to enable writing or reading and rewriting of a ferroelectric capacitor designated in address and supplies a voltage of Vcc/2 to non-selected plate lines.

The sense amplifier 24 latches and amplifies the data read out from a bit line BL1 or BL2 when writing or reading and carries out rewriting (refresh).

The column decoder 25 selects a sense amplifier according to the address designation, outputs the read data latched in a sense amplifier, and supplies it to a sense amplifier corresponding to the write data.

Next, an explanation will be made of read and write operations of the ferroelectric memory shown in FIG. 2.

In the ferroelectric memory shown in FIG. 2, it is possible to operate the word lines WL1 and WL2 independently to store 1 bit of data in each group of ferroelectric capacitors connected to one transistor. Alternatively, it is also possible to operate the word line WL1 and word line WL2 simultaneously to store 1 bit of data in a pair of capacitor groups connected to the same plate line, that is, in FIG. 2, a pair of ferroelectric capacitors connected to TR1 and a pair of ferroelectric capacitors connected to TR2 can be used together to store 1 bit of data. In the former case, if the word line WL1 is selected, a reference voltage is supplied to the bit line BL2 by a not shown dummy cell, while if the word line WL2 is selected, a reference voltage is supplied to the bit line BL1 by a not shown dummy cell.

Next, read and write operations of the memory device shown in FIG. 2 by operating word lines WL1 and WL2 independently to store 1 bit of data in each group of ferroelectric capacitors will be explained. Specifically, the explanation will be made taking as an example the case in which the word line WL1 and the plate line PL1 are selected, the bit line BL1 is selected as a column, and the memory cell C1+C2 is accessed.

First, the read operation will be explained below.

In the initial state of the read operation, the voltages of the plate lines PL1 to PL4 and the bit line BL1 are fixed to Vcc/2. In this state, a voltage of Vcc+α is supplied to the word line WL1 selected by the row decoder 22, whereby the memory cells C1+C2, C3+C4, C5+C6, and C7+C8 are selected. Due to this, transistor TR1 is turned on, and the node electrode ND1 is connected to the bit line BL1.

Next, the voltage of the selected plate line PL1 is changed from Vcc/2 to 0V, and the bit line BL1 is placed in a floating state after being equalized to 0V.

Then, the voltage on the selected plate line PL1 is raised from 0V to the power voltage Vcc while keeping the voltage of the non-selected plate lines PL2 to PL4 fixed to Vcc/2. At this time, if the ferroelectric capacitors C1 and C2 that are connected to the selected plate line PL1 are polarized along the direction from the node electrode ND1 to the plate line PL1 (define this state of polarization as data "1"), the voltage of Vcc is being supplied in a direction opposite to the original polarization. Consequently, the polarization states in the ferroelectric capacitors C1 and C2 are switched, and the switching charge is released to the bit line BL1. On the other hand, if the ferroelectric capacitors C1 and C2 are polarized along the direction from the plate line PL1 to the node electrode ND1 (define this state of polarization as data "0"), switching current does not occur because the voltage is being supplied in a direction the same as the polarization.

Therefore, the rise of the voltage on the bit line BL1 is large when data "1" is stored in the ferroelectric capacitors C1 and C2 and becomes small when data "0" is stored. On the other hand, for the bit line BL2 paired with the bit line BL1, a not shown dummy cell causes a voltage rise between them in the cases of data "1" and data "0". In other words, a reference voltage of a value between the voltage rises in the cases of the data "1" and data "0" is supplied to the bit line BL2.

Next, examples will be presented to show the changes of the voltage rises of the bit line BL1 in the case of a memory cell of the present embodiment including two capacitors connected in parallel and in the case of the related art in which each memory cell has only one capacitor.

When data "1" is stored in the ferroelectric capacitors C1 and C2, the polarization state is switched, and the voltage rise $\Delta V_+$ on the bit line BL1 due to the switching charge is represented by the following formula (1). When data "0" is stored, the polarization state does not change, and the voltage rise $\Delta V_-$ on the bit line BL1 is represented by the following formula (2).

$$\Delta V_+ = Vcc"[C_+"/\{(M-1)"C_-+C_++CBL\}] \quad (1)$$

$$\Delta V_+ = Vcc"[C_-"/\{M"C_-+C_++CBL\}] \quad (2)$$

where, $C_+$ is the capacitance of the memory cell C1+C2 when the polarization state is switched, $C_-$ is the capacitance of the memory cell C1+C2 when the polarization state is not switched, and CBL is the parasitic capacitance of the bit line BL1. M is the number of the plate lines connected to the bit line BL1. M is four in FIG. 2. In addition, the power voltage is 3.3V.

In a memory cell of the related art, when a cell is formed by a capacitor in a single capacitor layer, for example, by a capacitor C1, $C_+ \approx 500$ pF, $C_- \approx 100$ pF, and CBL$\approx$1000 pf or so. Therefore, from formulae (1) and (2), $\Delta V_+$ and $\Delta V_-$ are approximately as follows:

$\Delta V_+ = 0.92V$ $\Delta V_- = 0.24V$

In the present embodiment, in a memory cell, there are two capacitor layers, that is, two capacitors are connected in parallel, so the values of $C_+$ and $C_-$ are doubled and become 1000 pF and 200 pf, respectively. CBL does not change since it is the parasitic capacitance of the bit line BL1. Therefore, from formulae (1) and (2), the voltage rises $\Delta V_+$ and $\Delta V_-$ on the bit line BL1 in case of the present embodiment are approximately as follows:

$\Delta V_+ = 1.27V$ $\Delta V_- = 0.37V$

That is, the voltage rises rise largely.

If the number of plate lines connected to a bit line (M) is large, for example, M=8, the voltage rises on a bit line in a memory having the configuration of the related art become $\Delta V_+ = 0.75V$ and $\Delta V_- = 0.18V$. In a memory having a configuration of the present embodiment, the voltage rises become $\Delta V_+ = 0.97V$ and $\Delta V_- = 0.25V$.

The difference of the above changes in voltage on bit lines BL1 and BL2 is detected and amplified by the activated sense amplifier 24. Due to this, when data "1" is stored in the memory cell C1+C2, the bit line BL1 is driven by the voltage of Vcc, and the BL2 by 0V. When data "0" is stored in the memory cell C1+C2, the bit line BL1 is driven by 0V, and BL2 by the voltage of Vcc.

In the above read operation, the stored data is destroyed when data "1" is stored in the memory cell C1+C2, therefore, it is necessary to correctly return it to the state before the read operation by rewriting. Specifically, the voltage of the plate line PL1 is changed from Vcc to 0V, thereby to switch again the polarizations of the ferroelectric capacitors C1 and C2, whose polarizations have been switched once, and to write the original data to the memory cell. That is, by driving the bit lines BL1 and BL2 through the sense amplifier 24 and changing the voltage of the plate line PL1 from Vcc to 0V, both data "1" and "0" are rewritten by supplying a voltage of Vcc, and the state before the read operation is completely reset.

As shown above, by driving the selected plate line PL1, data stored in the memory cell C1+C2 is read out to the sense amplifier 24, amplified, and rewritten. Then, only data from the sense amplifier of the selected column is sent to a not shown I/O line and output.

When writing data to the memory cell C1+C2, the power voltage Vcc+$\alpha$ is supplied to the word line WL1 designated and selected in address by a control system through the row decoder 22. Due to this, the transistor TR1 is turned on, and memory cells C1+C2, C3+C4, C5+C6, and C7+C8 connected to the transistor TR1 are selected. On the other hand, the non-selected word line WL2 is maintained at 0V, and the transistor TR2 remains in the OFF state.

In this state, a voltage of 0V is supplied to the plate line PL1 designated and selected in address by a control system through the plate decoder 23, then the power voltage Vcc is supplied. In addition, a voltage of Vcc/2 is supplied to the non-selected plate lines PL2 to PL4 by the plate decoder 23.

Here, for example, if it is desired to write data "0" to the sense amplifier 24, a voltage of 0V is supplied to the bit line BL1 from the sense amplifier 24. At this time, the voltage on the selected plate line PL1 is maintained at the power voltage Vcc. Therefore, the ferroelectric capacitors C1 and C2 in the selected memory cell C1+C2 exhibit polarization states from the plate electrodes toward the node electrodes, and data "0" is written to the memory cell C1+C2. After that, polarization switching does not occur and the stored state of the data "0" is maintained even if the voltage of the selected line PL1 is lowered to 0V.

On the other hand, if it is desired to write data "1" to the sense amplifier 24, the bit line BL1 is driven by the sense amplifier 24 at a voltage of Vcc. At this time, the voltage on the selected plate line PL1 is maintained at the power voltage Vcc. Therefore, a write operation is not carried out. Then, the voltage of the selected line PL1 is lowered to 0V. As a result, the ferroelectric capacitors C1 and C2 exhibit polarization states from the node electrodes toward the plate electrodes, and data "1" is written to the memory cell C1+C2.

After the operation of writing desired data to the memory cell C1+C2 is finished, rewriting to the non-selected cells is performed (refresh operation).

According to the present embodiment, in a ferroelectric memory of a 1C structure having the smallest memory cell area, the effective area of the capacitor in a cell is increased two-fold while maintaining the smallest memory cell area. Compared with the related art, the capacitance of the capacitor and the stored charge in the capacitor of a memory cell are also increased two-fold, and the amount of charge contained in a signal from a sense amplifier is largely increased. Consequently, a higher degree of integration for a FeRAM becomes possible. This is quite useful in practice.

Second Embodiment

Figure 3:
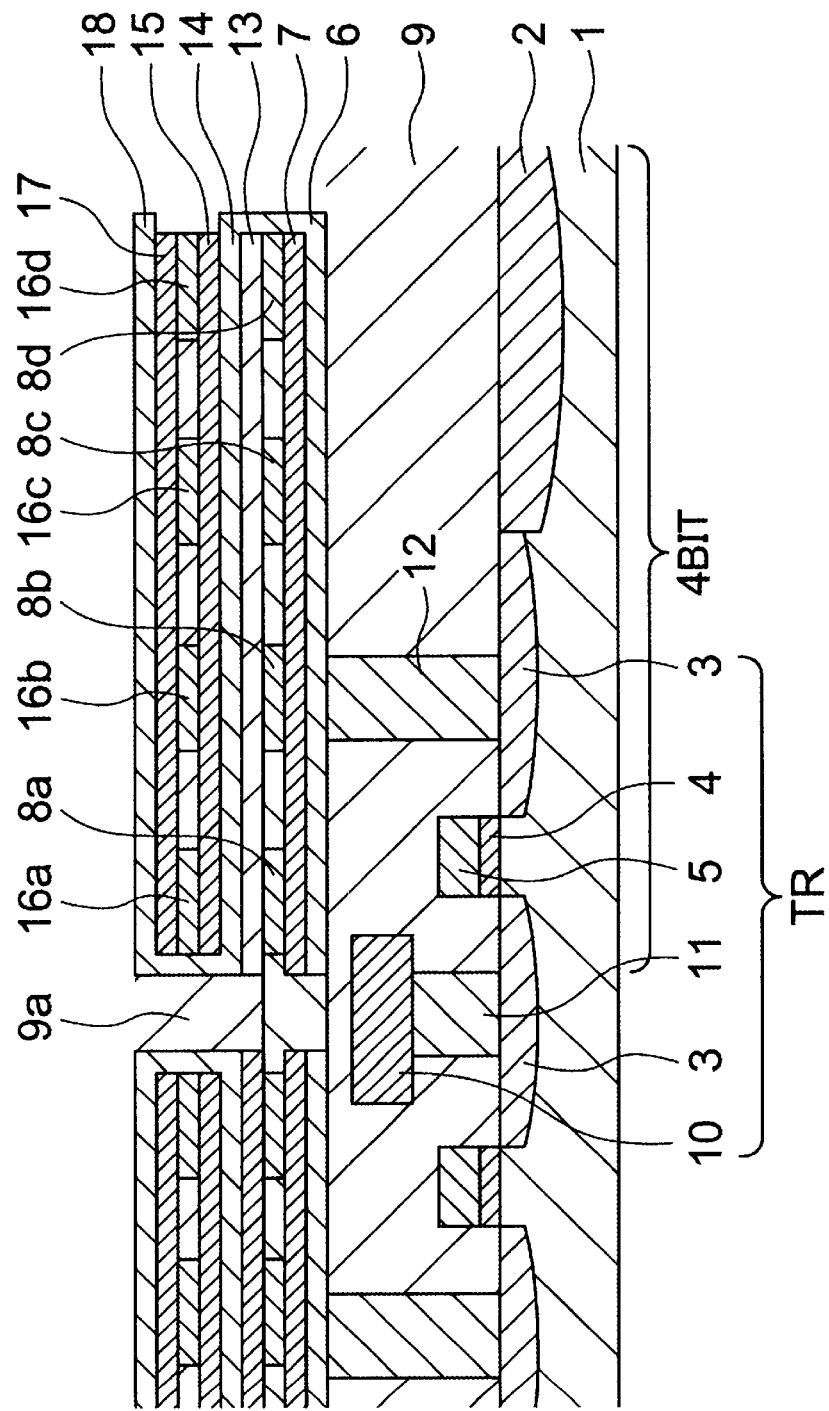
FIG. 3 is a sectional view of an example of the configuration of a semiconductor memory device according to a second embodiment of the present invention.

FIG. 3 is a partial sectional view of the configuration of a ferroelectric memory given as an example of a semiconductor memory device according to the present embodiment. This is formed by folding back once the memory cell block according to the first embodiment in the vertical direction.

The ferroelectric memory shown in FIG. 1 includes a semiconductor substrate 1, an element separation region 2, a drain source region 3, a gate insulating film 4, a gate electrode (word line) 5, a first node electrode 6 serving as a common lower electrode of four ferroelectric capacitors, a first ferroelectric film 7, plate electrodes 8a, 8b, 8c, and 8d forming plate lines PL1, PL2, PL3, and PL4, interlayer insulating films 9, 9a, a bit line 10 (BL1), contact plugs 11, 12, a second ferroelectric film 13, a second node electrode 14, a third ferroelectric film 15, plate electrodes 16a, 16b, 16c, and 16d, a fourth ferroelectric film 17, and a third node electrode 18.

The first node electrode 6, the second node electrode 14, the third node electrode 18, the plate electrodes 8a, 8b, 8c, and 8d, and the plate electrodes 16a, 16b, 16c, and 16d preferably include at least one of Pt, Ir, Ru, Rh, Re, Os, and Pd of the noble metal family. Alternatively, oxides of the above noble metals can be used as the node electrodes and the plate electrodes. Here, for example, a 150 nm thick Ir film is used for the first node electrode 6, and 100 nm thick Ir films are used for the second node electrode 14, the third node electrode 18, plate electrodes 8a, 8b, 8c, and 8d, and the plate electrodes 16a, 16b, 16c, and 16d.

In the same way as the first embodiment, as the ferroelectric material in ferroelectric nonvolatile memories, use can be made of ones having an $ABO_3$ type Perovskite crystal structure such as $SrTiO_3$, $(Ba,Sr)TiO_3$, $Pb(Zr,Ti)O_3$, $(Pb,La)(Zr,Ti)O_3$, $PbTiO_3$, $BaTiO_3$, $LiNbO_3$, $LiTaO_3$, and $YMnO_3$, or ones including bismuth-layered compounds of a Perovskite crystal structure such as $SrBi_2Ta_2O_9$, $SrBi_2Nb_2O_9$, $SrBi_2(Ta,Nb)_2O_9$, $Bi_4Ti_3O_{12}$, $SrBi_4Ti_4O_{15}$, $SrBi_4(Ti,Zr)_4O_{15}$, $Bi_3TiNbO_9$, $Bi_3TiTaO_9$, $BaBi_2Ta_2O_9$, and $BaBi_2Nb_2O_9$.

Here, as an example, a 100 nm thick SBT film ($SrBi_2Ta_2O_9$) is used for the first ferroelectric film 7, the second ferroelectric film 13, the third ferroelectric film 15, and the fourth ferroelectric film 17.

As shown in FIG. 3, the first ferroelectric film 7 is formed on the first node electrode 6, the plate electrodes 8a, 8b, 8c, and 8d are formed at predetermined intervals on the first ferroelectric film 7, the second ferroelectric film 13 is formed on the plate electrodes 8a, 8b, 8c, and 8d, and the second node electrode 14 is formed on the second ferroelectric film 13.

Further, the third ferroelectric film 15 is formed on the second node electrode 14, the plate electrodes 16a, 16b, 16c, and 16d are formed at predetermined intervals on the third ferroelectric film 15, the fourth ferroelectric film 17 is formed on the plate electrodes 16a, 16b, 16c, and 16d, and the third node electrode 18 is formed on the fourth ferroelectric film 17.

The first node electrode 6 is connected to the drain source region 3 through the contact plug 12 and is further connected to the bit line 10 (BL1) through the transistor TR and the contact plug 11.

The first node electrode 6, the second node electrode 14, and the third node electrode 18 are electrically connected to each other. The plate electrodes 8a and 16a, 8b and 16b, 8c and 16c, and 8d and 16d are connected to each other, respectively.

As shown in FIG. 3, the first node electrode 6, the first ferroelectric film 7, and the plate electrodes 8a, 8b 8c, and 8d; the plate electrodes 8a, 8b, 8c, and 8d, the second ferroelectric film 13, and the second node electrode 14; the second node electrode 14, the plate electrodes 16a, 16b, 16c, and 16d, and the third ferroelectric film 15; and the plate electrodes 16a, 16b, 16c, and 16d, the third node electrode 18, and the fourth ferroelectric film 17 each form four ferroelectric capacitors and form four capacitor layers each having the four above capacitors.

Since the first node electrode 6, the second node electrode 14, and the third node electrode 18 are electrically connected to each other and the plate electrodes 8a and 16a, 8b and 16b, 8c and 16c, and 8d and 16d are connected to each other, for example, for the plate electrodes 8a and 16a, the capacitors below and above the plate electrode 8a and the capacitors below and above the plate electrode 16a are connected in parallel with each other. This same is true for the other plate electrodes.

In the present embodiment, such four capacitors connected in parallel form a memory cell storing 1 bit of data. FIG. 3 shows a memory cell block including four such kinds of capacitor groups, thus four memory cells storing a maximum of 4 bits of data. These cells are connected to the bit line BL1 through the contact plug 12, the transistor TR, and the contact plug 11.

As explained above, the memory cell block of the present embodiment shown in FIG. 3 is formed by folding back once the memory cell block of the first embodiment in the vertical direction.

Therefore, in the present embodiment, the effective area of the capacitor in each memory cell is increased four-fold without increasing the area of a planar region storing 1 bit of data (memory cell) on the semiconductor substrate compared with the cell area in a memory device of the related art. Due to this, the capacitance of and the charge stored in the capacitor in each memory cell are also increased four-fold compared with the related art, and the charge contained in a signal obtained by a sense amplifier rises too.

Figure 4:
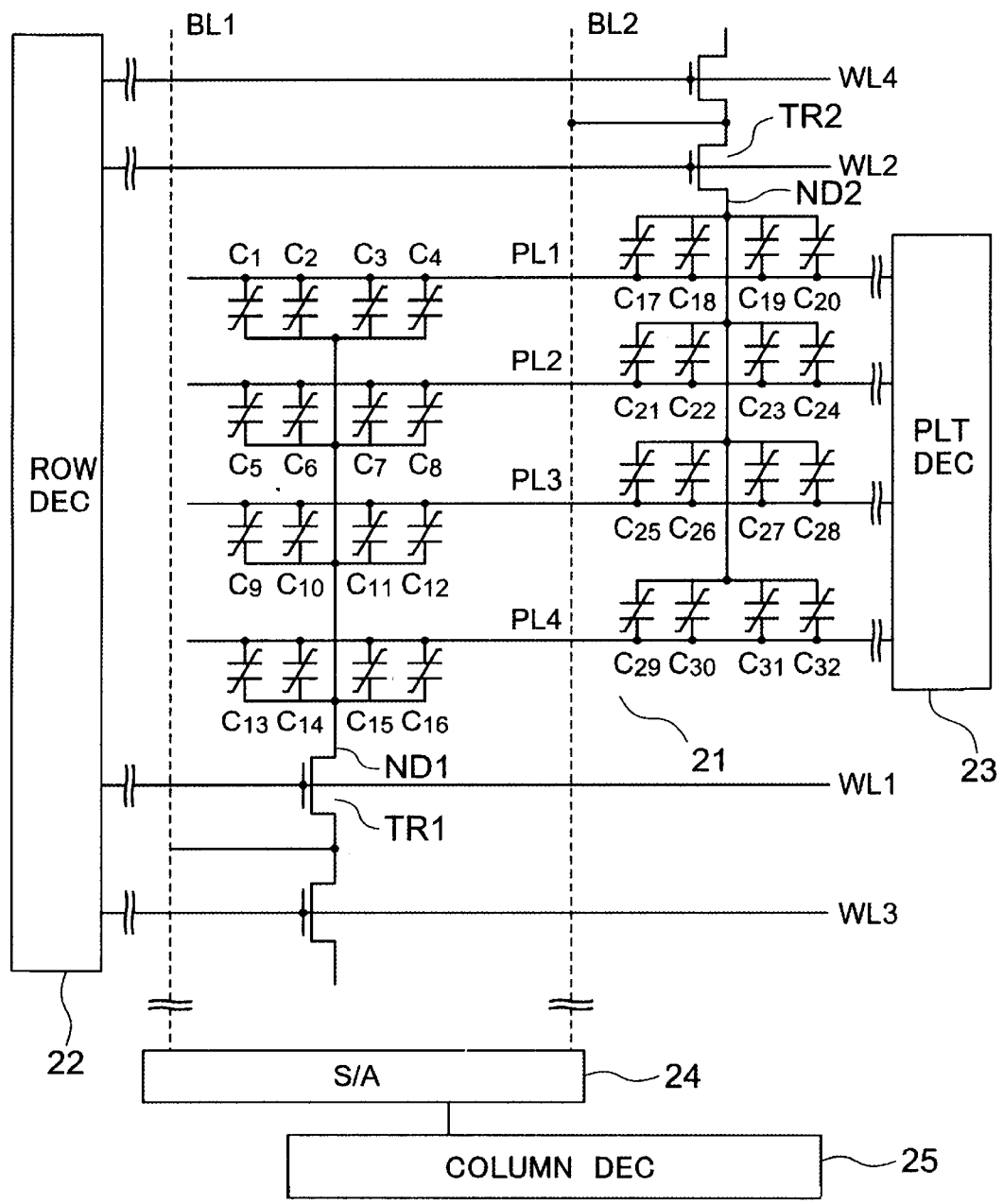
FIG. 4 is an equivalent circuit of an example of a semiconductor memory device according to the second embodiment of the present invention.

FIG. 4 shows an example of an equivalent circuit of a ferroelectric memory formed by the memory cell block shown in FIG. 3.

The ferroelectric memory shown in FIG. 4, in the same way as shown in FIG. 2, includes a memory cell array 21, a row decoder 22, a plate decoder 23, a sense amplifier (S/A) 24, and a column decoder 25. However, each memory cell in the ferroelectric memory shown in FIG. 4 is formed by four ferroelectric capacitors connected in parallel.

Hereinafter, using symbols of the four ferroelectric capacitors connected in parallel in each memory cell, the memory cells are indicated by C1+C2+C3+C4, C5+C6+C7+C8, C9+C10+C11+C12, C13+C14+C15+C16, C17+C18+C19+C20, C21+C22+C23+C24, C25+C26+C27+C28, and C29+C30+C31+C32.

In FIG. 4, in the same way as the first embodiment, in the memory cells C1+C2+C3+C4, C5+C6+C7+C8, C9+C10+

C11+C12, and C13+C14+C15+C16 arranged in the same column, one electrode of each capacitor is connected to a node electrode ND1 and is connected to the bit line BL1 through an n-channel MOS transistor TR1 arranged in the same column. The other electrodes of all the above capacitors are connected to the plate line PL1, PL2, PL3, and PL4, respectively, enabling independent read and write operations relative to the memory cells C1+C2+C3+C4, C5+C6+C7+C8, C9+C10+C11+C12, and C13+C14+C15+C16.

Similarly, the columns of the memory cells C17+C18+C19+C20, C21+C22+C23+C24, C25+C26+C27+C28, and C29+C30+C31+C32 are connected to a node electrode ND2 and a transistor TR2.

The gate electrode of the transistor TR1 is connected to a word line WL1, and the gate electrode of the transistor TR2 is connected to a word line WL2.

The row decoder 22 supplies a predetermined power voltage Vcc+α(α represents a voltage higher than the threshold voltage of the transistor TR1 or TR2) to a word line (word line WL1 or WL2 in FIG. 4) designated in address and keeps the transistor TR1 or TR2 on.

The plate decoder 23 supplies a predetermined voltage of 0V or Vcc to a plate line designated in address during data access so as to enable writing, or reading, and rewriting of a ferroelectric capacitor designated in address and supplies a voltage of Vcc/2 to non-selected plate lines.

The sense amplifier 24 latches and amplifies the data read out from a bit line BL1 or BL2 when writing or reading and carries out rewriting (refresh).

The column decoder 25 selects a sense amplifier according to an address designation, outputs the read data latched in the sense amplifier, and supplies it to a sense amplifier corresponding to the write data.

The read and write operations of the ferroelectric memory shown in FIG. 4 are performed in the same way as that shown in FIG. 2. Overlapping explanations will be omitted appropriately.

For example, when the word line WL1 and the plate line PL1 are selected and the bit line BL1 is selected as a column to read the memory cell C1+C2+C3+C4, in the initial state of the read operation, the voltages of the plate lines PL1 to PL4 and bit line BL1 are fixed to Vcc/2. In this state, a voltage of Vcc+α is supplied to the word line WL1 selected by the row decoder 22, whereby memory cells C1+C2+C3+C4, C5+C6+C7+C8, C9+C10+C11+C12, and C13+C14+C15+C16 are selected. Due to this, the transistor TR1 is turned on, the node electrode ND1 is connected to the bit line BL1.

Next, the voltage of the selected plate line PL1 is changed from Vcc/2 to 0V, and the bit line BL1 is placed in a floating state after being equalized to 0V.

Then, the voltage on the selected plate line PL1 is raised from 0V to the power voltage Vcc while keeping the voltage of the non-selected plate lines PL2 to PL4 fixed to Vcc/2. At this time, if the ferroelectric capacitors C1, C2, C3, and C4 connected to the selected plate line PL1 are polarized along the direction from the node electrode ND1 to the plate line PL1 (data "1"), the voltage of Vcc is being supplied in a direction opposite to the original polarization. Consequently, the polarization states in the ferroelectric capacitors C1, C2, C3, and C4 are switched, and a switching charge is released to the bit line BL1. On the other hand, if the ferroelectric capacitors C1, C2, C3, and C4 are polarized along the direction from the plate line PL1 to the node electrode ND1 (data "0"), switching current does not occur because the voltage is being supplied in a direction the same as the polarization.

Therefore, the rise of the voltage on the bit line BL1 is large when data "1" is stored in the ferroelectric capacitors C1, C2, C3, and C4 and becomes small when data "0" is stored.

Next, the formulae (1) and (2) shown in the first embodiment will be used to estimate the change of the voltage rise of the bit line BL1 in the case of a memory cell of the present embodiment including four capacitors connected in parallel and in the case of the related art in which each memory cell has only one capacitor.

In the present embodiment, in each memory cell, four capacitors (for example C1, C2, C3, and C4) are connected in parallel, so the values of $C_+$, $C_-$ in formulae (1) and (2) are four times those of a single capacitor, therefore $C_+ \approx 2000$ pF and $C_- \approx 400$ pF. In addition, since CBL≈1000 pF and the power voltage is 3.3V, from formulae (1) and (2), $\Delta V_+ = 1.57V$ and $\Delta V_- = 0.51V$ in the present embodiment. The voltage rise is largely increased compared with the case of a single capacitor shown in the first embodiment.

If the number (M) of plate lines connected to a bit line is eight (M=8), the voltage rises become $\Delta V_+ = 1.14V$ and $\Delta V_- = 0.31V$ in a memory having the configuration of the present embodiment.

The explanation of the rest of the operation will be omitted.

According to the present embodiment, in a ferroelectric memory of a 1C structure having the smallest memory cell area, the effective area of the capacitor in a cell is increased four-fold while maintaining the smallest memory cell area. Compared with the related art, the capacitance of the capacitor and the stored charge in the capacitor of a memory cell are also increased four-fold, and the amount of charge contained in a signal from a sense amplifier is largely increased. Consequently, a higher degree of integration for a FeRAM becomes possible. This is quite useful in practice.

Third Embodiment

Figure 5:
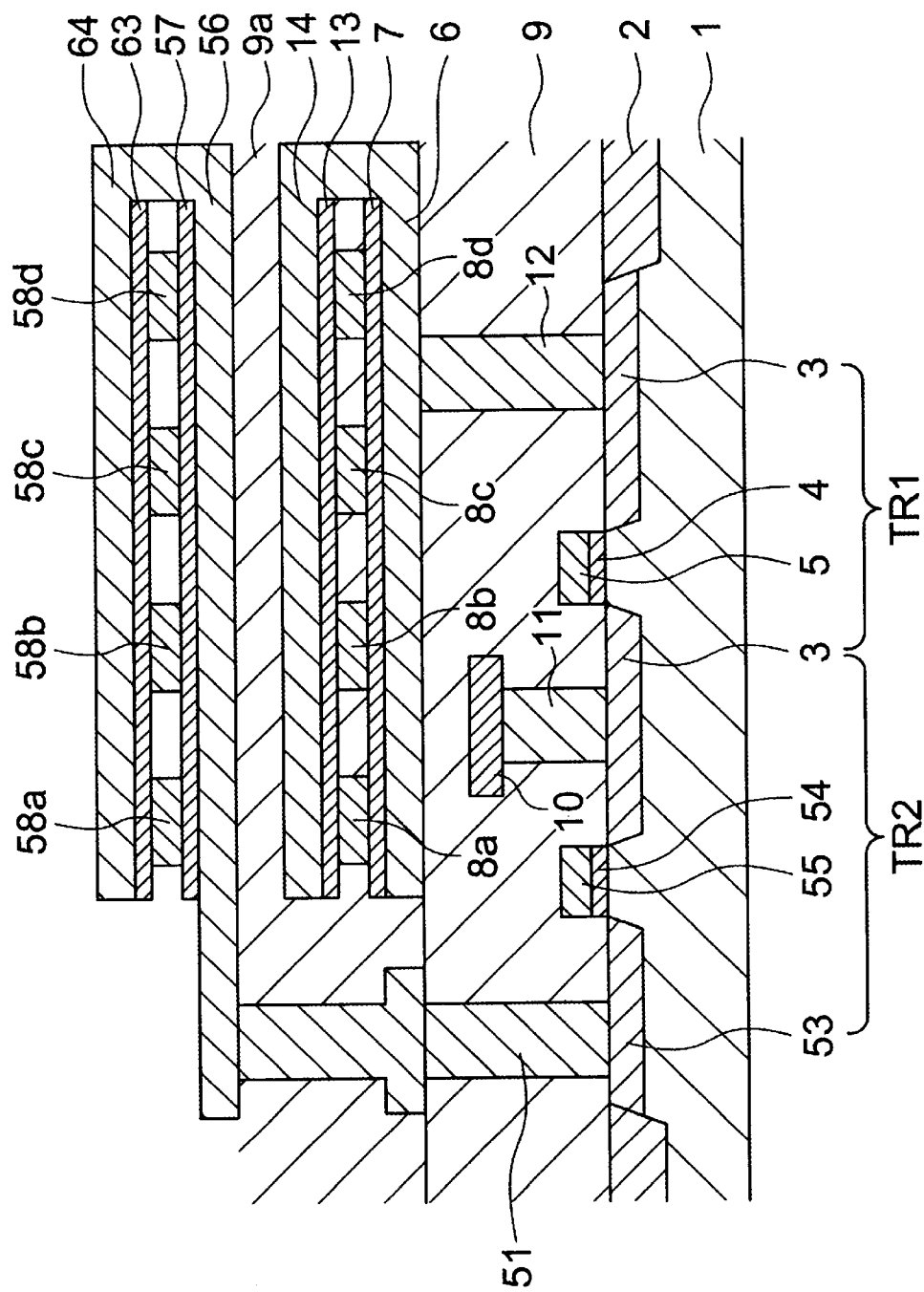
FIG. 5 is a sectional view of an example of the configuration of a semiconductor memory device according to a third embodiment of the present invention.

FIG. 5 is a partial sectional view of the configuration of a ferroelectric memory given as an example of a semiconductor memory device according to the present embodiment. This is formed by overlapping two memory cell blocks shown in the first embodiment.

The ferroelectric memory shown in FIG. 5 includes a semiconductor substrate 1, an element separation region 2, drain source regions 3 and 53, gate insulating films 4 and 54, gate electrodes (word lines) 5 and 55, first node electrodes 6 and 56 each serving as a common lower electrode of four ferroelectric capacitors, first ferroelectric films 7 and 57, plate electrodes 8a, 8b; 8c, and 8d and 58a, 58b, 58c, and 58d, interlayer insulating films 9 and 9a, a bit line 10 (BL1), contact plugs 11, 12, and 51, second ferroelectric films 13 and 63, and second node electrodes 14 and 64.

As shown in FIG. 5, for example, a polysilicon contact plug 11 is formed in the interlayer insulating film 9 above one side of the drain source region 3 between the word lines 5 and 55 and is electrically connected to this side of the drain source region 3. On the contact plug 11, the bit line 10 is formed.

For example, a polysilicon contact plug 12 is formed in the interlayer insulating film 9 above the other side of the drain source region 3 and is electrically connected to the other side of the drain source region 3.

For example, a polysilicon contact plug 51 is formed in the interlayer insulating film 9 above the drain source region 53 and is electrically connected to the drain source region 53.

On the contact plug 12, the first node electrode 6 is formed. The first node electrode 6 is connected to the bit line 10 (BL1) through the transistor TR1 and the contact plug 11.

The first ferroelectric film 7 is formed on the first node electrode 6, and the plate electrodes 8a, 8b, 8c, and 8d are formed at predetermined intervals on the first ferroelectric film 7. The plate electrodes 8a, 8b, 8c, and 8d form plate lines PL1, PL2, PL3, and PL4.

Further, the second ferroelectric film 13 is formed on the plate electrodes 8a, 8b, 8c, and 8d, and the second node electrode 14 is formed on the second ferroelectric film 13. The first node electrode 6 is electrically connected to the second node electrode 14.

The first node electrode 6, the first ferroelectric film 7, and the plate electrodes 8a, 8b, 8c, and 8d form four ferroelectric capacitors, while the plate electrodes 8a, 8b, 8c, and 8d, the second ferroelectric film 13, and the second node electrode 14 form other four ferroelectric capacitors.

In the same way, the first node electrode 56 is formed on the contact plug 51. The first node electrode 56 is connected to the bit line 10 (BL1) through the transistor TR2 and the contact plug 51.

The first ferroelectric film 57 is formed on the first node electrode 56, the plate electrodes 58a, 58b, 58c, and 58d are formed at predetermined intervals on the first ferroelectric film 57, and the plate electrodes 58a, 58b, 58c, and 58d are connected to the plate lines PL1, PL2, PL3, and PL4, respectively. That is, the plate electrodes 58a, 58b, 58c, and 58d are connected with the plate electrodes 8a, 8b, 8c, and 8d, respectively.

Further, the second ferroelectric film 63 is formed on the plate electrodes 58a, 58b, 58c, and 58d, and the second node electrode 64 is formed on the second ferroelectric film 63. The first node electrode 56 is electrically connected to the second node electrode 64.

The first node electrode 56, the first ferroelectric film 57, and the plate electrodes 58a, 58b, 58c, and 58d form four ferroelectric capacitors, while the plate electrodes 58a, 58b, 58c, and 58d, the second ferroelectric film 63, and the second node electrode 64 form other four ferroelectric capacitors.

As shown in FIG. 5, the structure of the stacked layers from the first node electrode 6 to the second node electrode 14 and the structure of the stacked layers from the first node electrode 56 to the second node electrode 64 are stacked in the vertical direction so as to overlap with each other. Due to this, the two memory blocks occupy the same planar area, so the occupied area of each memory block is reduced to half, thus an even higher degree of integration is possible.

The first node electrodes 6 and 56, the second node electrodes 14 and 64, and the plate electrodes 8a, 8b, 8c, and 8d and 56a, 56b, 56c, 56d preferably include at least one of Pt, Ir, Ru, Rh, Re, Os, and Pd of the noble metal family. Alternatively, oxides of the above noble metals can be used as the node electrodes and the plate electrodes. In the same way as in the previous embodiments, as the ferroelectric material in ferroelectric nonvolatile memories, use can be made of ones having an $ABO_3$ type Perovskite crystal structure such as $SrTiO_3$, $(Ba,Sr)TiO_3$, $Pb(Zr,Ti)O_3$, $(Pb,La)(Zr,Ti)O_3$, $PbTiO_3$, $BaTiO_3$, $LiNbO_3$, $LiTaO_3$, and $YMnO_3$, or ones including bismuth-layered compounds of a Perovskite crystal structure such as $SrBi_2Ta_2O_9$, $SrBi_2Nb_2O_9$, $SrBi_2(Ta,Nb)_2O_9$, $Bi_4Ti_3O_{12}$, $SrBi_4Ti_4O_{15}$, $SrBi_4(Ti,Zr)_4O_{15}$, $Bi_3TiNbO_9$, $Bi_3TiTaO_9$, $BaBi_2Ta_2O_9$, and $BaBi_2Nb_2O_9$.

Here, for example, a 150 nm thick Ir film is used for the first node electrode 6 and 56, and 100 nm thick Ir films are used for the second node electrode 14, the third node electrode 18, the plate electrodes 8a, 8b, 8c, and 8d, and the plate electrodes 56a, 56b, 56c, and 56d.

Further, as an example, a 100 nm thick SBT film ($SrBi_2Ta_2O_9$) is used for the first ferroelectric films 7 and 57 and the second ferroelectric films 13 and 63.

As explained in the first embodiment, the memory cell block including the first node electrode 6, the first ferroelectric film 7, the plate electrodes 8a, 8b, 8c, and 8d, the second ferroelectric film 13, and the second node electrode 14, which are formed on the contact plug 12, has four memory cells each comprising two capacitors connected in parallel and is able to store a maximum of 4 bits of data.

Similarly, the memory cell block including the first node electrode 56, the first ferroelectric film 57, the plate electrodes 58a, 58b, 58c, and 58d, the second ferroelectric film 63, and the second node electrode 64, which are formed on the contact plug 51, also has four memory cells each comprising two capacitors connected in parallel and is able to store a maximum of 4 bits of data.

That is to say, in the present embodiment, the effective area of the capacitor in each memory cell is increased two-fold without increasing the area of a planar region storing 1 bit of data (memory cell) on the semiconductor substrate compared with the cell area in a memory device of the related art. Due to this, the capacitance of and the charge stored in the capacitor in each memory cell are also increased two-fold compared with the related art, and the charge contained in a signal obtained by a sense amplifier rises too. Furthermore, by superposing two or more memory blocks, the planar area occupied by each memory block is further reduced, and the degree of integration is increased.

Figure 6:
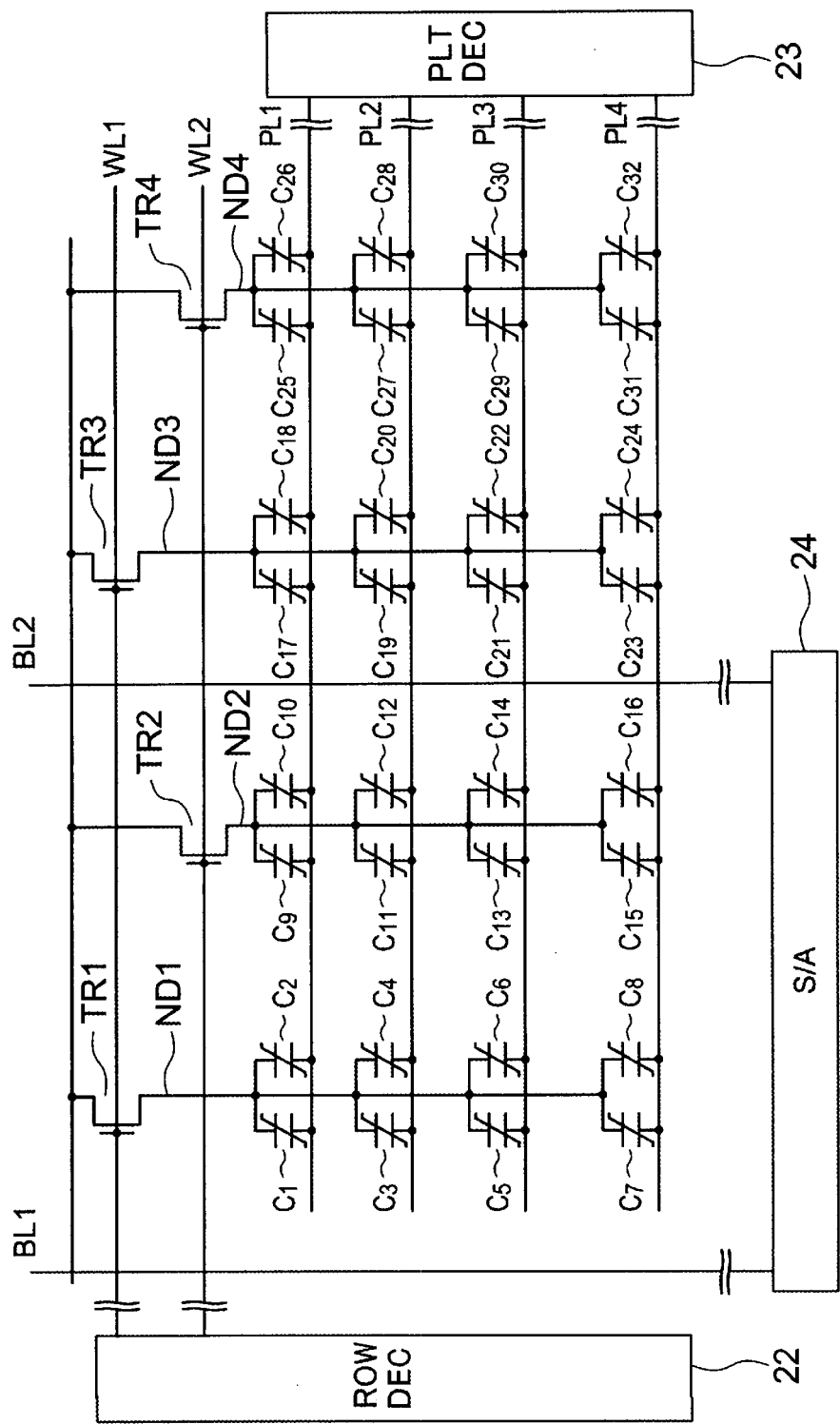
FIG. 6 is an equivalent circuit of a semiconductor memory device according to the third embodiment of the present invention.

FIG. 6 shows an example of an equivalent circuit of a ferroelectric memory formed by the memory cell block shown in FIG. 5.

In the ferroelectric memory shown in FIG. 6, data is stored by writing complementary data to a pair of ferroelectric capacitor groups. Therefore, the ferroelectric memory shown in FIG. 6 stores 8 bits of data.

As shown in FIG. 6, in the ferroelectric memory, the word lines WL1 and WL2 and the plate lines PL1, PL2, PL3, and PL4 are arranged in the same direction, and the bit lines BL1 and BL2 are arranged so as to intersect the above lines. The word lines W11 and W12 are connected to a row decoder 22, while the plate lines PL1, PL2, PL3, and PL4 are connected to a plate decoder 23. In addition, the bit lines BL1 and BL2 form a pair connected to a sense amplifier 24.

The bit line BL1 is connected to the node electrode ND1 and ND2 through transistors TR1 and TR2.

Four memory cells are connected to the node electrode ND1. Each of the four memory cells is formed by two ferroelectric capacitors connected in parallel. That is, capacitors C1 and C2, C3 and C4, C5 and C6, and C7 and C8 form four memory cells. Hereinafter, these four memory cells are indicated as C1+C2, C3+C4, C5+C6, and C7+C8, respectively. One electrode of each of the capacitors C1 and C2, C3 and C4, C5 and C6, and C7 and C8 are connected to the node electrode ND1, and the other electrodes of these capacitors are connected to the plate line PL1, PL2, PL3, and PL4, respectively.

Similarly, four memory cells are connected to the node electrode ND2. Each of the four memory cells is formed by two ferroelectric capacitors connected in parallel. That is, the capacitors C9 and C10, C11 and C12, C13 and C14, and C15 and C16 form four memory cells. Hereinafter, these four memory cells are indicated by C9+C10, C11+C12, C13+C14, and C15+C16, respectively. One electrode of each of the capacitors C9 and C10, C11 and C12, C13 and C14, and C15 and C16 are connected to the node electrode ND2, and the other electrodes of these capacitors are connected to the plate line PL1, PL2, PL3, and PL4, respectively.

In the same way, the bit line BL2 is connected to the node electrode ND3 and ND4 through the transistors TR3 and TR4.

Four memory cells are connected to the node electrode ND3. Each of the four memory cells is formed by two ferroelectric capacitors connected in parallel, that is, the capacitors C17 and C18, C19 and C20, C21 and C22, and C23 and C24. Hereinafter, these four memory cells are indicated by C17+C18, C19+C20, C21+C22, and C23+C24, respectively. One electrode of each of the ferroelectric capacitors C17 and C18, C19 and C20, C21 and C22, and C23 and C24 is connected to the node electrode ND3, and the other electrodes of these capacitors are connected to the plate line PL1, PL2, PL3, and PL4, respectively.

Similarly, four memory cells are connected to the node electrode ND4. Each of the four memory cells is formed by two ferroelectric capacitors connected in parallel, that is, capacitors C25 and C26, C27 and C28, C29 and C30, and C31 and C32. Hereinafter, these four memory cells are indicated by C25+C26, C27+C28, C29+C30, and C31+C32, respectively. One electrode of each of the capacitors C25 and C26, C27 and C28, C29 and C30, and C31 and C32 is connected to the node electrode ND4, and the other electrodes of these capacitors are connected to the plate line PL1, PL2, PL3, and PL4, respectively.

The gate electrodes of the transistors TR1 and TR3 are connected to a word line WL1, and the gate electrodes of the transistors TR2 and TR4 are connected to a word line WL2.

The row decoder 22 supplies a predetermined power voltage Vcc+α (α represents a voltage higher than the threshold voltage of the transistor TR1 or TR2) to a word line designated in address and keeps the transistors connected on.

The plate decoder 23 supplies a predetermined voltage to a plate line PL1, PL2, PL3, or PL4 designated in address during data access so as to enable writing or reading and rewriting of a ferroelectric capacitor designated in address and supplies a voltage of Vcc/2 to non-selected plate lines.

The sense amplifier 24 latches and amplifies the data read out from a bit line BL1 or BL2 when writing or reading and carries out rewriting (refresh).

The column decoder 25 selects a sense amplifier according to the address designation, outputs the read data latched in a sense amplifier, and supplies it to a sense amplifier corresponding to the writing data.

Next, an explanation will be made of read and write operations of the ferroelectric memory shown in FIG. 6. In the ferroelectric memory shown in FIG. 6, data is stored by writing complementary data to a pair of memory cells. For example, the memory cell C1+C2 and the memory cell C17+C18 each store complementary 1 bit of data.

Here, the explanation will be made taking as an example reading data from the memory cells C1+C2 and C17+C18. In the following explanation, it is assumed that data "1" has been written in the memory cell C1+C2, and data "0" has been written in the memory cell C17+C18.

Before starting the read operation, all bit lines and plate lines are grounded. Once the read operation is started, as the initial state, the voltages of the plate lines PL1 to PL4 and the bit lines BL1 and BL2 are fixed to Vcc/2 (Vcc represents the power voltage). In this state, voltages of the word lines WL1 and WL2 are set to a high level by the row decoder 22, whereby the transistors TR1, TR2, TR3, and TR4 are turned on. Due to this, the node electrode ND1 and ND2 are connected to the bit line BL1, and the node electrode ND3 and ND4 are connected to the bit line BL2.

Next, the voltages of the non-selected word lines are set to the low level, and the non-selected node electrodes ND2 and ND4 are placed in a floating state.

Next, the voltage of the selected plate line PL1 is changed from Vcc/2 to 0V, and the bit lines BL1 and BL2 are placed in a floating state after being equalized to 0V.

Then, the voltage on the selected plate line PL1 is raised from 0V to the power voltage Vcc while keeping the voltages of the non-selected plate lines PL2 to PL4 fixed to Vcc/2. At this time, the polarization is switched in the ferroelectric capacitors C1 and C2 storing the data "1", a switching charge is released to the bit line BL1, and a potential difference occurs between the bit lines BL1 and BL2.

Next, the change of the voltage rise on the bit line BL1 will be estimated.

Because the data "1" is stored in the ferroelectric capacitors C1 and C2, the polarization state is switched, and the voltage rise $\Delta V_+$ on the bit line BL1 due to the switching charge is represented by the formula (1) explained in the first embodiment. Further, if the number (M) of the plate lines connected to the bit line BL1 is four, and the power voltage Vcc is 3.3V, the voltage rise $\Delta V_+$ on the bit line BL1 is 1.27V, largely increased compared with a value of 0.92 in the case of the related art in which a memory cell has a single capacitor.

In addition, as to the change of the voltage rise on the bit line BL2, because data "0" is stored in ferroelectric capacitors C17 and C18, the polarization state does not change, and the voltage rise $\Delta V_-$ on the bit line BL2 is represented by the formula (2) explained in the first embodiment. Under the same conditions as above, the voltage rise $\Delta V_-$ is 0.37V, increased compared with a value of 0.24 in the case of the related art in which a memory cell has a single capacitor.

Next, the sense amplifier 24 is activated to read out the data. At this time, the voltage of the bit line BL1 is set to Vcc, BL2 is driven by 0V, and data "0" is rewritten to the memory cell C17+C18. After that, the voltage of the bit line BL1 is set to 0V, and data "1" is rewritten to the memory cell C1+C2. Consequently, the state before the read operation is completely reset.

Next, the voltages of the plate lines PL1, PL2, PL3, and PL4 are set to 0V, the non-selected word lines WL2 are set to a high level, and all node electrodes are set to 0V.

According to the present embodiment, in a ferroelectric memory of a 1C structure having the smallest memory cell area, the effective area of the capacitor in a cell is increased two-fold while maintaining the smallest memory cell area. Compared with the related art, the capacitance of the capacitor and the stored charge in the capacitor of a memory cell are also increased two-fold, and the amount of charge contained in a signal from a sense amplifier is largely increased. Furthermore, by superposing two or more memory blocks, the planar area occupied by a memory block is further reduced, and the degree of integration can be further increased. Consequently, a higher degree of integration for a FeRAM becomes possible. This is quite useful in practice.

Fourth Embodiment

Figure 7:
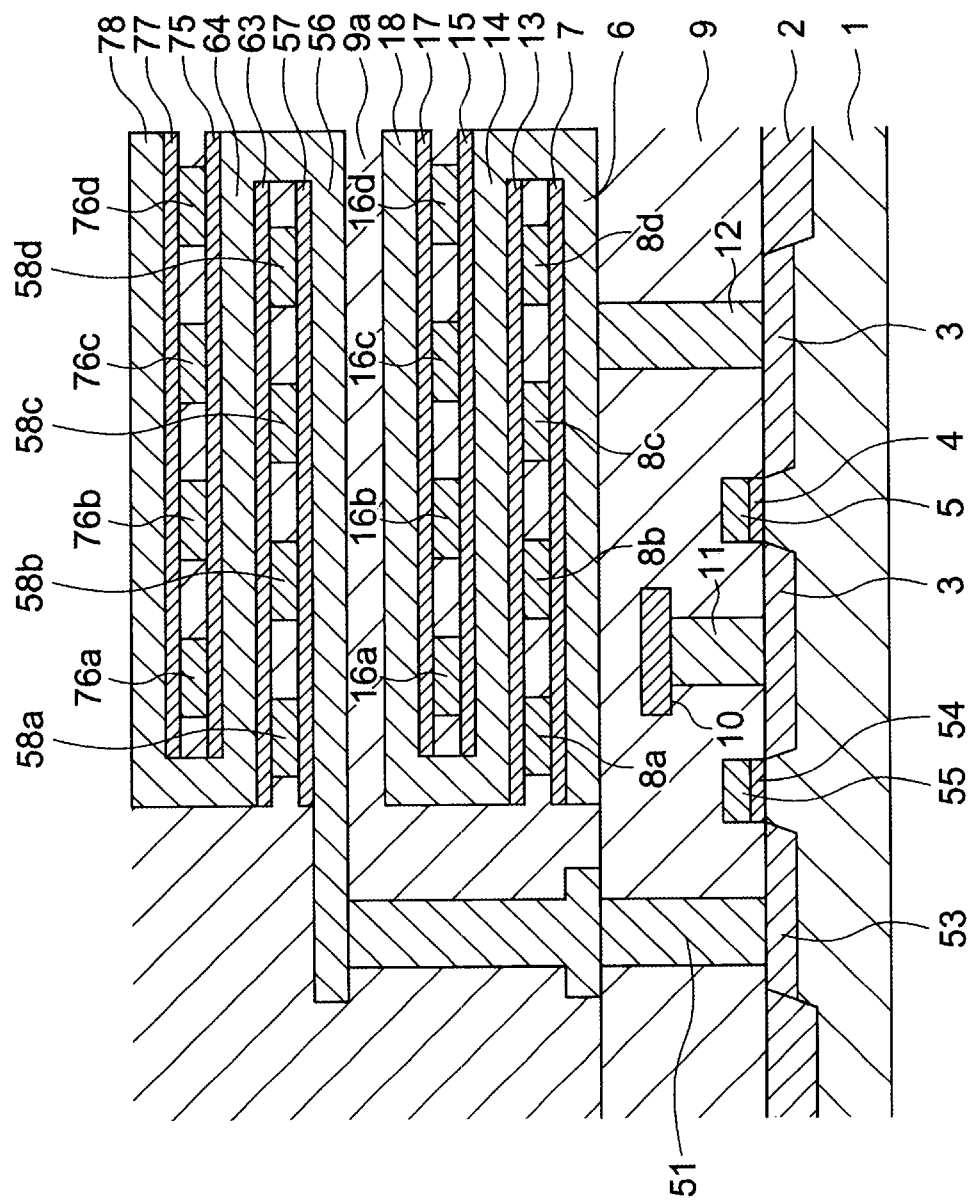
FIG. 7 is a sectional view of an example of the configuration of a semiconductor memory device according to a fourth embodiment of the present invention.

FIG. 7 is a partial sectional view of the configuration of a ferroelectric memory given as an example of a semiconductor memory device according to the present embodiment. This is formed by overlapping two memory cell blocks shown in the second embodiment.

The ferroelectric memory shown in FIG. 7 includes a semiconductor substrate 1, an element separation region 2, drain source regions 3 and 53, gate insulating films 4 and 54, gate electrodes (word lines) 5 and 55, first node electrodes 6 and 56 each serving as a common lower electrode of four ferroelectric capacitors, first ferroelectric films 7 and 57, plate electrodes 8a, 8b, 8c, and 8d and 58a, 58b, 58c, and 58d, interlayer insulating films 9 and 9a, a bit line 10 (BL1), contact plugs 11, 12, and 51, second ferroelectric films 13 and 63, second node electrodes 14 and 64, third ferroelectric films 15 and 75, plate electrodes 16a, 16b, 16c, and 16d and 76a, 76b, 76c, and 76d, fourth ferroelectric films 17 and 77, and third node electrodes 18 and 78.

In the following, explanations overlapping with the above embodiments will be omitted appropriately.

As shown in FIG. 7, the first node electrode 6, which is electrically connected to the contact plug 12, is connected to the bit line 10 (BL1) through the transistor TR1 and the contact plug 11.

The first node electrode 6 is formed, in order, with the first ferroelectric film 7, the plate electrodes 8a, 8b, 8c, and 8d, the second ferroelectric film 13, and the second node electrode 14.

Further, the third ferroelectric film 15 is formed on the second node electrode 14, the plate electrodes 16a, 16b, 16c, and 16d are formed at predetermined intervals on the third ferroelectric film 15, the fourth ferroelectric film 17 is formed on the plate electrodes 16a, 16b, 16c, and 16d, and the third node electrode 18 is formed on the fourth ferroelectric film 17.

The plate electrodes 8a and 16a, 8b and 16b, 8c and 16c, and 8d and 16d are electrically connected with each other. In addition, the first node electrode 6, the second node electrode 14, and the third node electrode 18 are also electrically connected with each other.

Similarly, the first node electrode 56, which is electrically connected to the contact plug 51, is connected to the bit line 10 (BL1) through the transistor TR2 and the contact plug 11.

The first node electrode 56 is formed, in order, with the first ferroelectric film 57, the plate electrodes 58a, 58b, 58c, and 58d, the second ferroelectric film 63, and the second node electrode 64. The first node electrode 6 is electrically connected to the second node electrode 14.

Further, the third ferroelectric film 75 is formed on the second node electrode 64, the plate electrodes 76a, 76b, 76c, and 76d are formed at predetermined intervals on the third ferroelectric film 75, the fourth ferroelectric film 77 is formed on the plate electrodes 76a, 76b, 76c, and 76d, and the third node electrode 78 is formed on the fourth ferroelectric film 77.

The plate electrodes 58a and 76a, 58b and 76b, 58c and 76c, and 58d and 76d are electrically connected with each other, respectively. In addition, the first node electrode 56, the second node electrode 64, and the third node electrode 78 are also electrically connected with each other.

As explained in the second embodiment, the structure of the stacked layers formed on the contact plug 12 from the first node electrode 6 to the third node electrode 18 has four memory cells each comprising four capacitors connected in parallel and is able to store a maximum of 4 bits of data.

Similarly, the structure of the stacked layers formed on the contact plug 51 from the first node electrode 56 to the third node electrode 78 also has four memory cells each comprising four capacitors connected in parallel and is able to store a maximum of 4 bits of data.

The structure of the stacked layers from the first node electrode 6 to the third node electrode 18 and the structure of the stacked layers from the first node electrode 56 to the third node electrode 78 are stacked in the vertical direction so as to overlap with each other. Due to this, the two memory blocks occupy the same planar area, so the occupied area of each memory block is reduced to half and thus an even higher degree of integration is possible.

As explained above, in the present embodiment, the effective area of the capacitor in each memory cell is increased four-fold without increasing the area of a planar region storing 1 bit of data (memory cell) on the semiconductor substrate compared with the cell area in a memory device of the related art. Due to this, the capacitance of and the charge stored in the capacitor in each memory cell are also increased four-fold compared with the related art, and the charge contained in a signal obtained by a sense amplifier rises too. Furthermore, by superposing two or more memory blocks, the planar area occupied by each memory block is further reduced, and the degree of integration is increased.

The selection of materials for use of the ferroelectric memory of the present embodiment is the same as the aforesaid embodiments.

Figure 8:
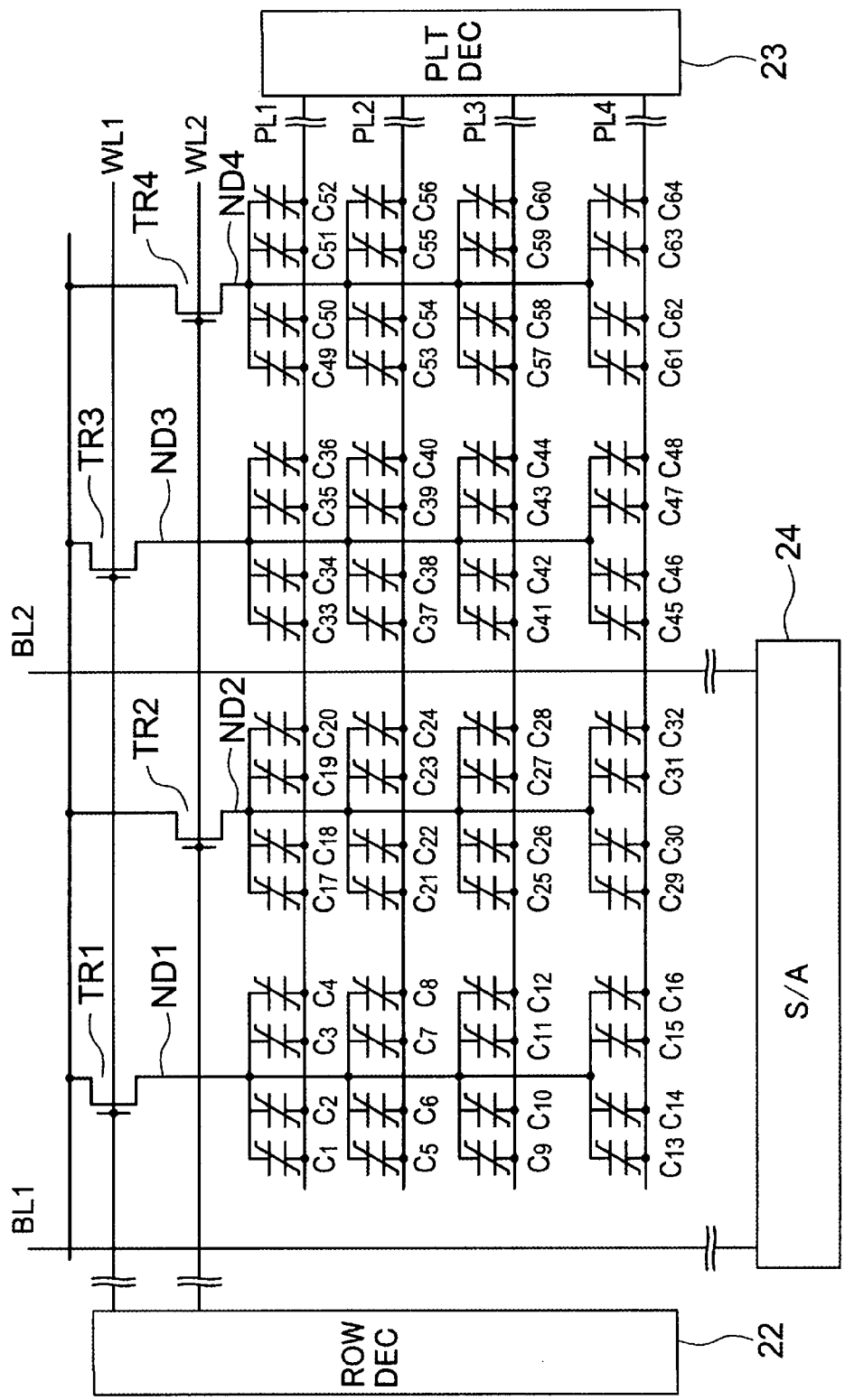
FIG. 8 is an equivalent circuit of an example of a semiconductor memory device according to the fourth embodiment of the present invention.

FIG. 8 shows an example of an equivalent circuit of a ferroelectric memory formed by the memory cell block shown in FIG. 7.

The basic configuration of the ferroelectric memory shown in FIG. 8 is substantially the same as that of the third embodiment, except that each memory cell is formed by four ferroelectric capacitors connected in parallel.

In the same way as in the above embodiments, when reading data out of a memory cell, if the polarization state is switched and the switching charge is released, the voltage change $\Delta V_+$ on a bit line is represented by the formula (1) explained in the first embodiment. If the number (M) of the plate lines connected to a bit line is four and the power voltage Vcc is 3.3V, the voltage rise $\Delta V_+$ on the bit line due to the polarization switching is 1.57V, largely increased compared with a value of 0.92 in the case of the related art in which a memory cell has a single capacitor.

If the polarization state does not change and the switching charge is not released, the voltage variation $\Delta V_-$ on a bit line is represented by formula (2) explained in the first embodiment. Under the same conditions as above, $\Delta V_-$ is 0.51V, increased compared with a value of 0.24 in the case of the related art in which a memory cell has a single capacitor.

The method for operating the ferroelectric memory shown in FIG. 8 is the same as that in the third embodiment, so an explanation is omitted.

According to the present embodiment, in a ferroelectric memory of a 1C structure having the smallest memory cell area, the effective area of the capacitor in a cell is increased four-fold while maintaining the smallest memory cell area. Compared with the related art, the capacitance of the capacitor and the stored charge in the capacitor of a memory cell are also increased four-fold, and the amount of charge contained in a signal from a sense amplifier is largely increased. Furthermore, by superposing two or more memory blocks, the planar area occupied by a memory block is further reduced, and the degree of integration can be further increased. Consequently, a higher degree of integration for a FeRAM becomes possible. This is quite useful in practice.

Fifth Embodiment

The present embodiment shows an example of a method for producing a ferroelectric memory shown in FIG. 1.

In the present embodiment, the noble metal Ir is used for the node electrodes and plate electrodes. When a noble metal having a low reactivity is used for the electrodes, because microprocessing by dry etching is quite difficult, the damascene method is suitable for the miniaturization. In the present embodiment, the damascene method is used for forming the node electrodes and plate electrodes.

Figure 9:
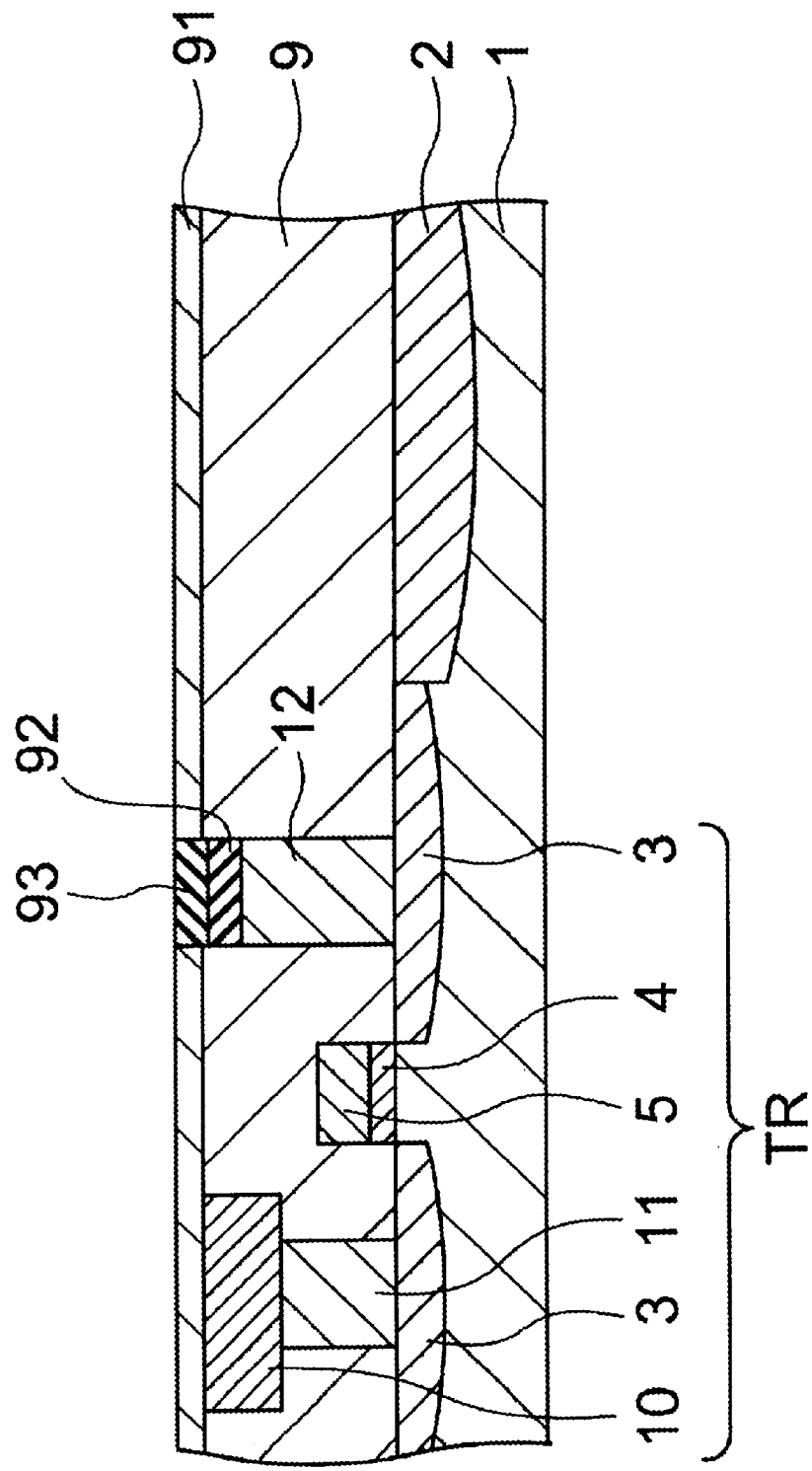
FIG. 9 is a sectional view for explaining a method according to a fifth embodiment of the present invention for producing the semiconductor memory device shown in FIG. 1.

First, as shown in FIG. 9, a silicon substrate 1 of the first conductivity is formed with an element separation region 2 having a LOCOS structure by a well-known method. Then, the surface of the silicon substrate 1 is oxidized to form a gate oxide film 4. Next, a polysilicon layer is deposited over the entire surface, then the polysilicon layer is patterned for example by photolithography or by etching to form a polysilicon gate electrode 5.

Next, impurity ions of a second conductivity are implanted to the two sides of the gate electrode 5, then the implanted impurity is activated to form a source-drain region 3. By this, a transistor TR is formed. Note that the gate electrode 5 also serves as a word line.

Next, for example, an interlayer insulating film 9 is formed from for example silicon oxide by chemical vapor deposition (CVD) to cover the transistor TR.

Then, in the interlayer insulating film 9 contacting one side of the source-drain region 3 of the transistor TR, a contact hole is made for forming a bit line 10 by well-known photolithography or by dry etching, and a polysilicon plug 11 is formed by burying polysilicon diffused with impurities. After that, the surface of the interlayer insulating film 9 and the polysilicon plug 11 is flattened by well-known chemical mechanical polishing(CMP), and the bit line 10 is formed by the well-known Al interconnection technique.

Next, for example, an interlayer insulating film 9 formed of for example silicon oxide is further deposited by CVD to cover the bit line 10 and the interlayer insulating film 9 is flattened by CMP.

On the flattened interlayer insulating film 9, a SiN film is formed to a thickness of 50 nm by CVD. This acts as an etching stopper layer 91 when forming a burying portion of the first node electrode.

Then, in the interlayer insulating film 9 contacting the other side of the source drain region 3 of the transistor TR, a polysilicon plug 12 is formed by the same method. After that, the polysilicon on the surface is removed by CMP.

Before forming a node electrode on the polysilicon plug 12, a silicide film and a diffusing barrier film are formed on the polysilicon plug 12 as protection films.

Because the plug 12 is formed from polysilicon, because of the polysilicon diffusion from the plug 12 during thermal processing, the electrode film that will be formed next will be silicided and deteriorated or an insulating film such as silicon oxide will be formed. To prevent this, usually, a silicide film is formed on the surface of the plug 12.

Further, to prevent reactions between the electrode film and the plug 12 at high temperatures and the diffusion from the electrode film and the ferroelectric film to the plug 12, usually a diffusion barrier film is formed between the plug 12 and the electrode using a nitride including Ti, Ta, or W.

In detail, the polysilicon inside the plug 12 is etch-backed by 150 nm by means of dry etching. On the plug 12, a cobalt silicide film 92 is formed for preventing diffusion of silicon by means of DC magnetron sputtering and the well-known rapid thermal annealing (RTA)

On the cobalt silicide film 92, a TiN film 93 is formed to a thickness of 200 nm by DC magnetron sputtering, then the TiN film on the surface is removed by CMP.

Note that, little of the SiN film serving as the etching stopper layer 91 is removed, because it has a high processing selection ratio in the above process.

Figure 10:
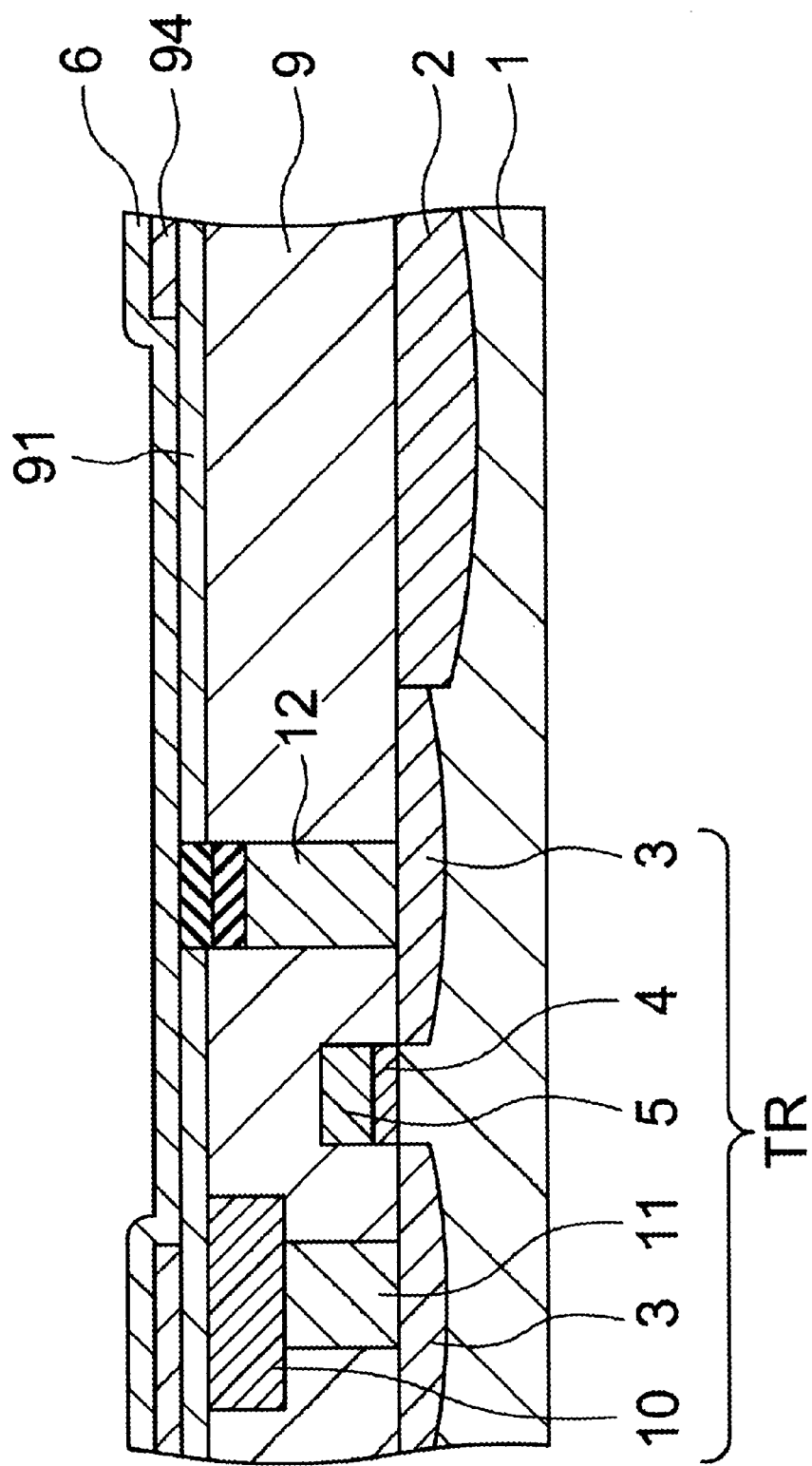
FIG. 10 is a sectional view continuing from FIG. 9 for explaining the method according to the fifth embodiment of the present invention for producing the semiconductor memory device.

Next, as shown in FIG. 10, as a burying layer of the first node electrode 6, an interlayer insulating film 94 is formed from silicon oxide by CVD to 200 nm, then the interlayer insulating film is patterned to form an opening of the first node electrode 6 by photolithography or dry etching.

Then, as the first node electrode 6, an Ir film is deposited into this opening to 150 nm by DC magnetron sputtering. The Ir film on the outside surface is removed by CMP.

While not shown in FIG. 10, before depositing the Ir film, an Ir-Hf film of for example a thickness of 20 nm may be formed in the opening as a bonding layer. After forming the Ir film, the Ir—Hf film on the surface is also removed by CMP.

Figure 11:
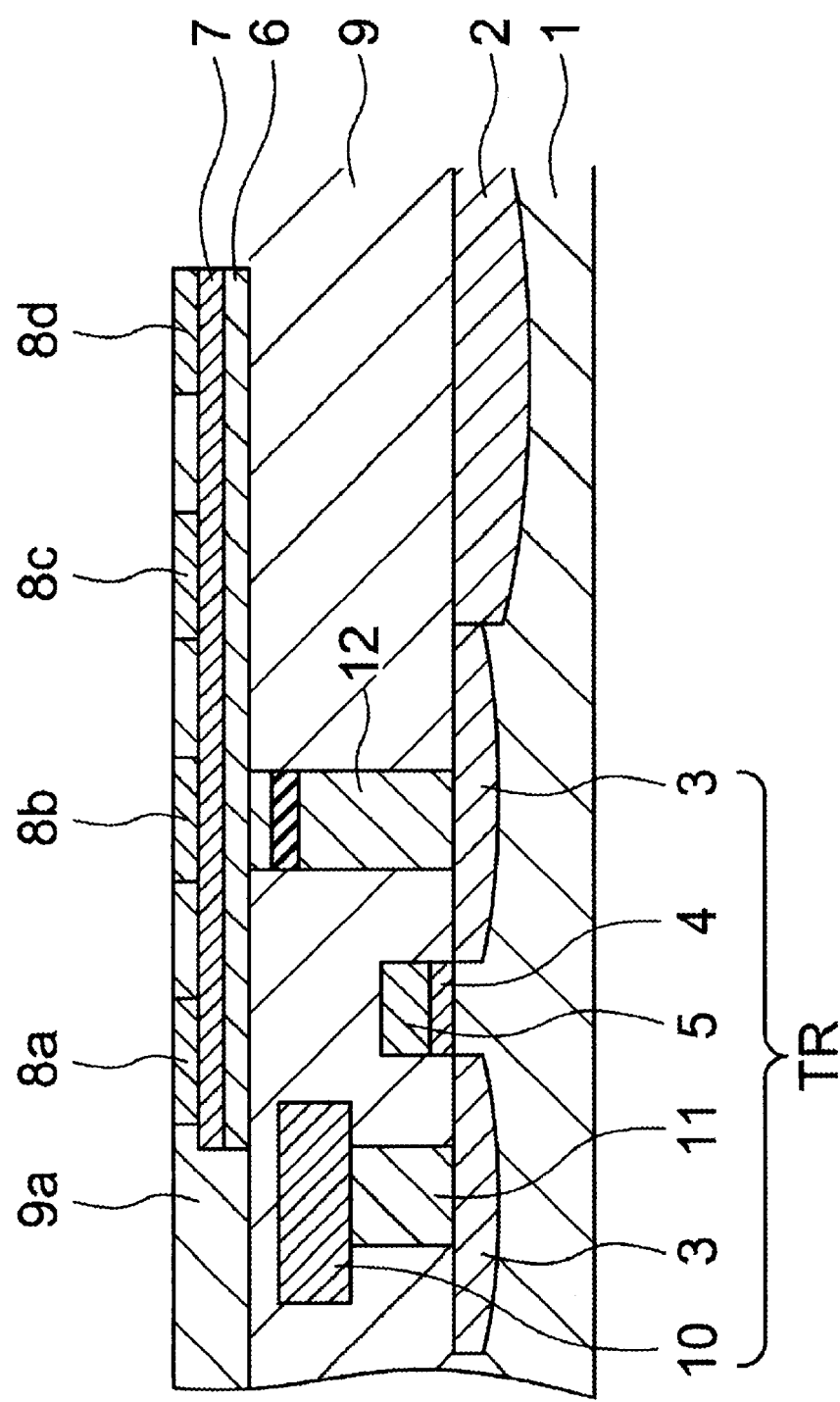
FIG. 11 is a sectional view continuing from FIG. 10 for explaining the method according to the fifth embodiment of the present invention for producing the semiconductor memory device.

Note that the etching-stopper layer 91 will not be shown from FIG. 11.

Next, as shown in FIG. 11, the first ferroelectric film 7 is formed on the first node electrode 6.

Here, as an example, a 100 nm thick SBT film ($SrBi_2Ta_2O_9$) is used for the first ferroelectric film 7.

A ferroelectric thin film of $SrBi_2Ta_2O_9On$ (SBT) is formed on the first node electrode 6 by chemical solution deposition (CSD). As the sol-gel precursor solution utilized above, a commercial one is used. The metal composition ratio in the solution is Sr/Bi/Ta=0.8/2.2/2.0. After coating the solution by well-known spin-coating, this is heated on a hot plate to a temperature of 250□C. for 5 minutes to cause volatilization, then is heated in a diffusing furnace in an oxygen atmosphere to 700□C. for 30 minutes. A 100 nm thick ferroelectric SBT film is formed by repeating these film forming processes three times.

Next, as a burying layer of the plate electrodes 8a, 8b, 8c, and 8d, an insulating film 9a is formed from silicon oxide by CVD on the first ferroelectric film 7, and patterns of plate electrodes 8a, 8b, 8c, and 8d are formed in the insulating film 9a by photolithography and dry etching. Then, on the first ferroelectric film 7, a 100 nm Ir film is buried into the formed patterns by sputtering. Then, the Ir deposited on the surface is removed to flatten the surface and thereby form the plate electrodes 8a, 8b, 8c, and 8d.

Next, the formed electrodes are processed to predetermined sizes by well-known photolithography and dry etching.

Figure 12:
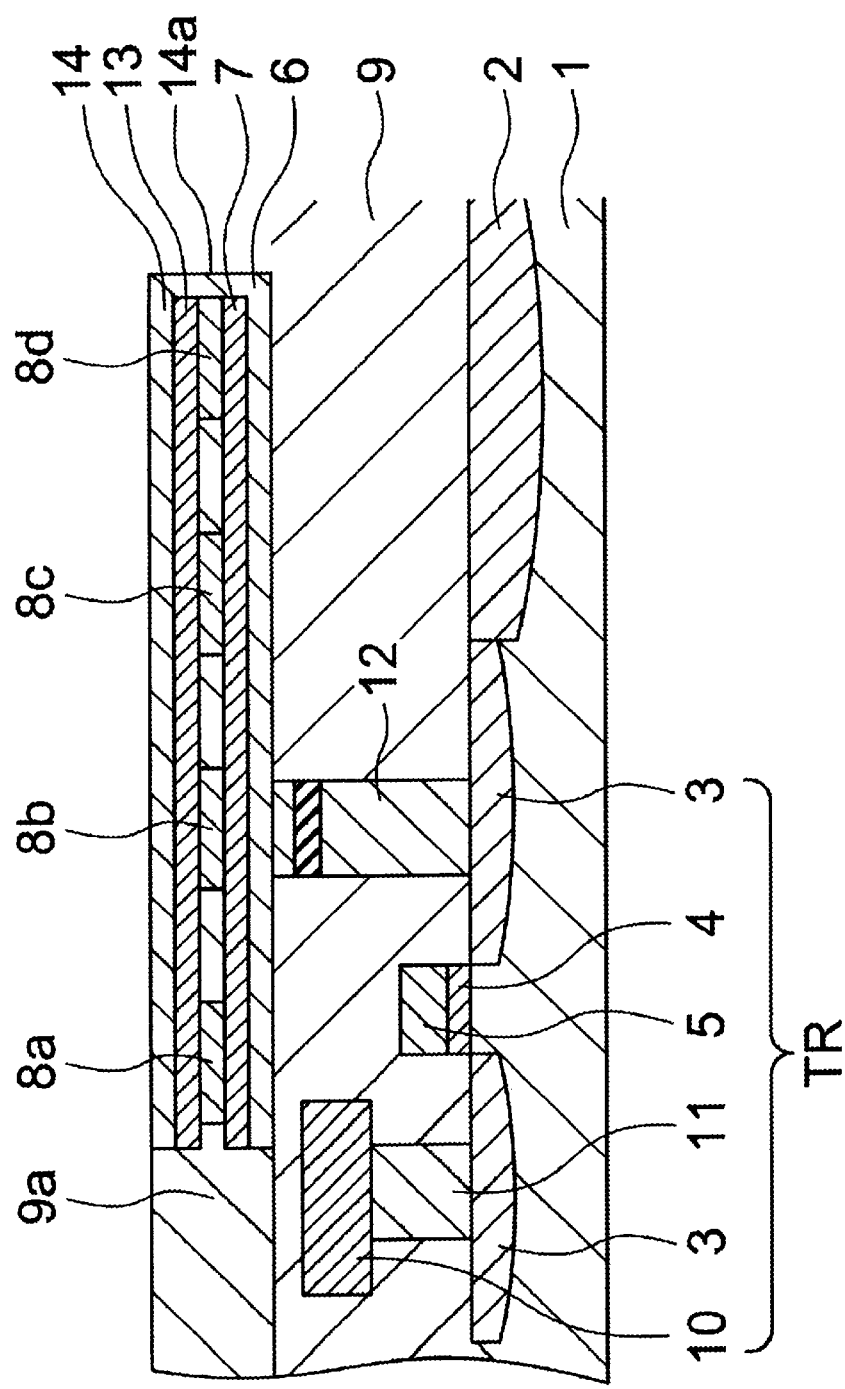
FIG. 12 is a sectional view continuing from FIG. 11 for explaining the method according to the fifth embodiment of the present invention for producing the semiconductor memory device.

Next, as shown in FIG. 12, as the second ferroelectric film 13, a SBT film of a thickness of 100 nm is formed in the same way as the first ferroelectric film 7. Then, an insulating film 9b is formed from an oxide film by CVD to cover the second ferroelectric film 13.

Then, on the insulating film 9b, the pattern of the second node electrode 14 and a via-hole 14a connecting the second node electrode 14 and the first electrode 6 are formed in the insulating film 9b. After that, a 100 nm Ir film is buried into the formed pattern and the via-hole 14a by sputtering, then the Ir deposited on the surface is removed by polishing to flatten the surface to thereby form the second node electrode 14 connecting with the first node electrode 6.

Next, the necessary interconnections are formed, whereby the ferroelectric memory of the present embodiment is completed.

The present embodiment has the same effects as the first embodiment.

Sixth Embodiment

The present embodiment shows an example of a method for producing a ferroelectric memory shown in FIG. 3.

First, in the same way as the fifth embodiment, the production steps shown up to FIG. 11 are carried out.

Figure 13:
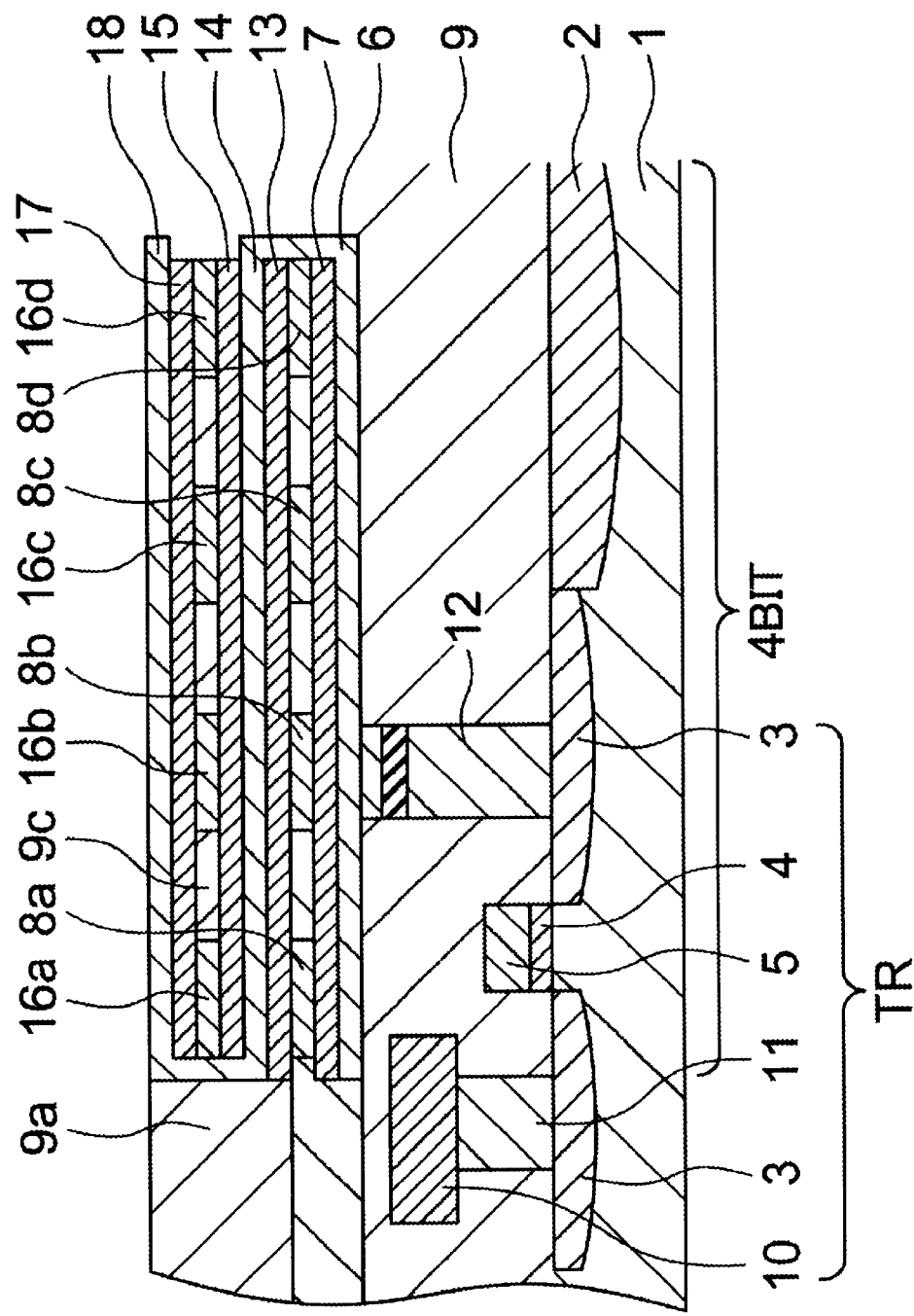
FIG. 13 is a sectional view for explaining a method according to a sixth embodiment of the present invention for producing the semiconductor memory device shown in FIG. 3.

After forming the second node electrode 14 in the step shown in FIG. 12, as shown in FIG. 13, a 100 nm thick SBT film ($SrBi_2Ta_2O_9$) is formed in the same way as the above on the second node electrode 14 as the third ferroelectric film 15.

Next, an insulating film 9c is formed for example from silicon oxide on the third ferroelectric film 15 by CVD to cover the third ferroelectric film 15. Then, the plate electrodes 16a, 16b, 16c, and 16d are formed by the well-known damascene method. On the insulating film 9c, interconnection channels used for the plate electrodes 16a, 16b, 16c, and 16d are formed, then a 100 nm thick Ir film is buried into the formed interconnections channels and onto the third ferroelectric film 15 to obtain the plate electrodes 16a, 16b, 16c, and 16d. After that, the Ir deposited outside of the channels is removed by polishing to flatten the surface.

Next, in the same way as that mentioned above, a 100 nm thick SBT film is formed as the fourth ferroelectric film 17. Then, an insulating film 9d is formed from silicon oxide by CVD to cover the fourth ferroelectric film 17.

Next, the formed electrodes are processed to predetermined sizes by the well-known photolithography and dry etching.

After that, the third node electrode 18 is formed on the insulating film 9d by the well-known dual damascene method. First, interconnection channels used for the third node electrode 18 and a via-hole 18a connecting the third node electrode 18 and the second electrode 14 are formed in the insulating film 9d. After that, a 100 nm Ir film is buried into the formed patterns and the via-hole 18a by sputtering to form the third node electrode 18 connecting with the second node electrode 14.

Next, necessary interconnections are formed, whereby the ferroelectric memory of the present embodiment is completed.

The present embodiment has the same effects as the first embodiment.

Seventh Embodiment

The present embodiment shows an example of a method for producing a ferroelectric memory shown in FIG. 5 and FIG. 7.

Figure 14:
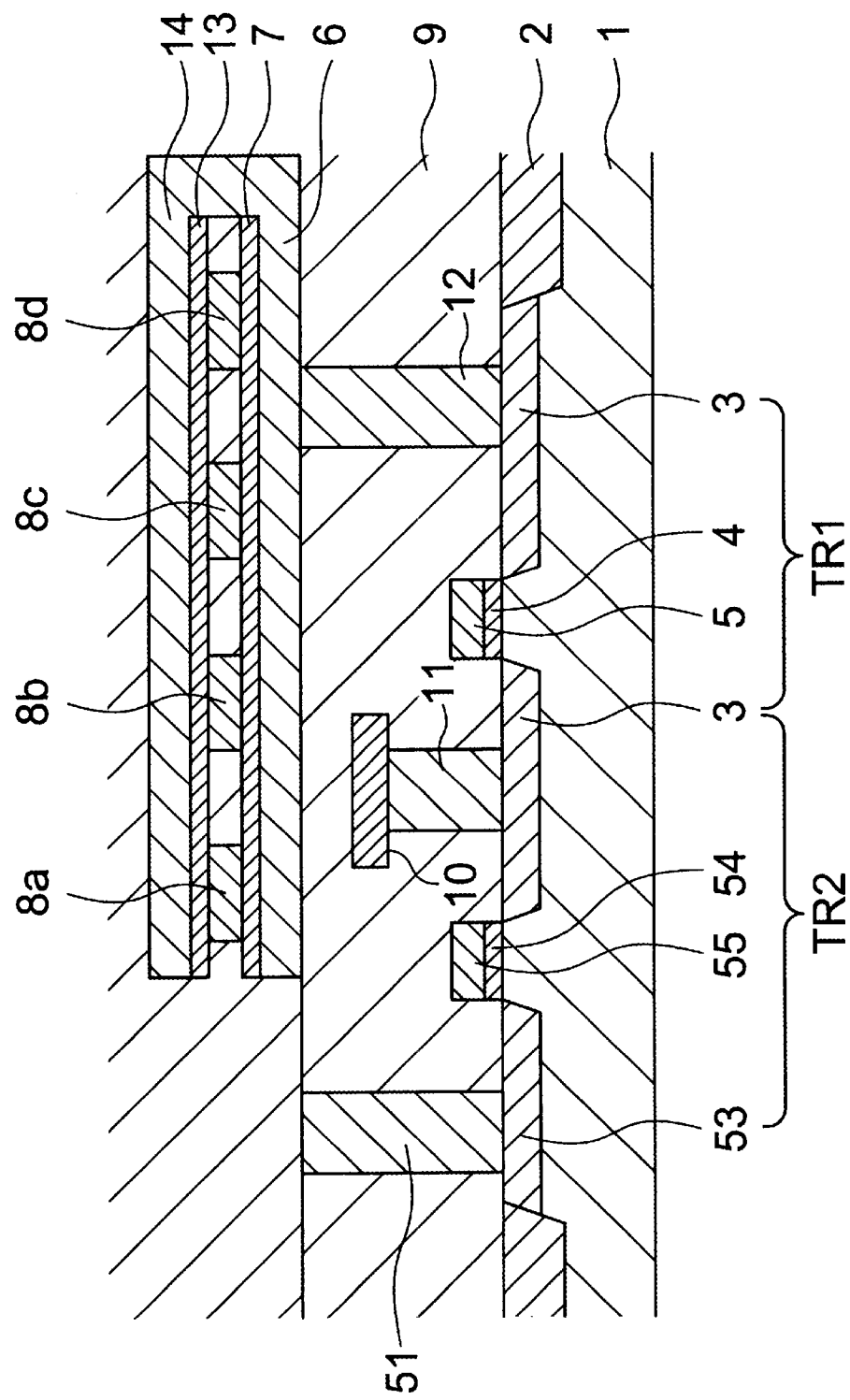
FIG. 14 is a sectional view for explaining a method according to a seventh embodiment of the present invention for producing the semiconductor memory device shown in FIG. 5.

When producing a ferroelectric memory shown in FIG. 5, first, as shown in FIG. 14, on predetermined areas of the semiconductor substrate 1, a transistor TR1 and transistor TR2 are formed by the MOSFET forming step as explained in the fifth embodiment. Then, in the source-drain region 3 between the transistors TR1 and TR2 and in the source-drain regions 3 and 53 on the two sides of the transistors TR1 and TR2, a polysilicon plug 11, bit line 10, and polysilicon plugs 12 and 51 are formed.

Next, by the same producing steps as in the fifth embodiment, the first node electrode 6 is formed, in order, with the first ferroelectric film 7, the plate electrodes 8a, 8b, 8c, and 8d, the second ferroelectric film 13, and the second node electrode 14.

Then, the upper end of the polysilicon plug 51 is formed, and the first node electrode 56 is formed on the polysilicon plug 51 to overlap the stacked layer structure of the first node electrode 6 to the second node electrode 14. The formation method is the same as above. After that, the first node electrode 56 is formed, in order, with the first ferroelectric film 57, the plate electrodes 58a, 58b, 58c, and 58d, the second ferroelectric film 63, and the second node electrode 64.

Next, the necessary interconnections are formed, whereby the ferroelectric memory in FIG. 5 is formed.

Figure 15:
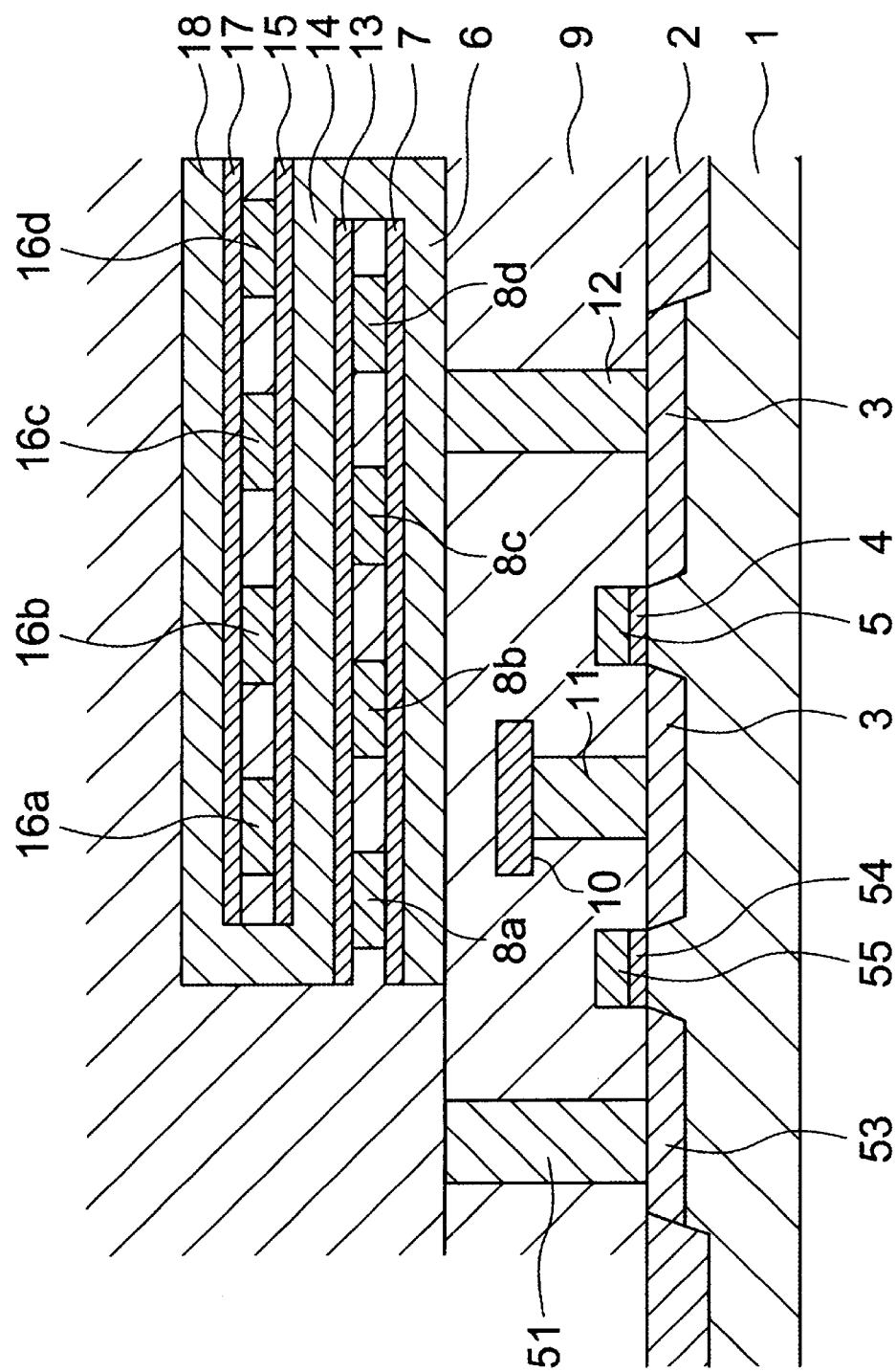
FIG. 15 is a sectional view for explaining a method according to the seventh embodiment of the present invention for producing the semiconductor memory device shown in FIG. 7.

When producing a ferroelectric memory shown in FIG. 7, first, as shown in FIG. 15, predetermined areas of the semiconductor substrate 1 are formed with the transistor TR1 and transistor TR2 by the same method mentioned above, while the source-drain region 3 between the transistors TR1 and TR2 and the source-drain regions 3 and 53 on the two sides of the transistors TR1 and TR2 are formed with a polysilicon plug 11, bit line 10, and polysilicon plugs 12 and 51.

Next, by the same producing steps as in the fifth embodiment, the first node electrode 6 is formed, in order, with the first ferroelectric film 7, the plate electrodes 8a, 8b, 8c, and 8d, the second ferroelectric film 13, the second node electrode 14, the third ferroelectric film 15, the plate electrodes 16a, 16b, 16c, and 16d, the fourth ferroelectric film 17, and the fourth node electrode 18.

Then, the upper end of the polysilicon plug 51 is formed, and the first node electrode 56 is formed on the polysilicon plug 51 to overlap the stacked layer structure of the first node electrode 6 to the third node electrode 18. The formation method is the same as the above. After that, the first node electrode 56 is formed, in order, with the first ferroelectric film 57, the plate electrodes 58a, 58b, 58c, and 58d, the second ferroelectric film 63, the second node electrode 64, the third ferroelectric film 75, the plate electrodes 76a, 76b, 76c, and 76d, the fourth ferroelectric film 77, and the fourth node electrode 78.

Next, the necessary interconnections are formed, whereby the ferroelectric memory in FIG. 7 is formed.

In the above producing steps, explanations and illustrations are omitted of formation of the etching stopper layer for using the damascene method and of a cobalt silicide film and a diffusion barrier layer on the plugs.

The present embodiment has the same effects as the third and fourth embodiments.

In the above, the present invention was explained according to preferred embodiments, but the present invention is not limited to the above embodiments. Numerous modifications could be made thereto without departing from the basic concept and scope of the invention.

For example, the configuration of the semiconductor memory device, methods of reading and writing, and methods of production explained in the present invention are just examples. Appropriate modifications thereto are possible.

Further, in the above embodiments, examples are presented in which two or four capacitor layers each including a common node electrode, a ferroelectric film, and a plate electrode are formed. However, the present invention is not limited to these. In principle, any number of layers such as three to five are possible.

In addition, in the third and fourth embodiments, examples are presented in which two structures of stacked capacitor layers are overlapped with each other, however, it is possible overlap more of such kinds of structures.

Summarizing the effects of the present invention, according to the present invention, by folding back ferroelectric capacitor layers, the capacitor in each memory cell has a structure in which two or more capacitors are connected in parallel. Due to this, in a ferroelectric memory of a 1C structure having the smallest memory cell area, the effective area of the capacitor in a cell is increased by two times or more while maintaining the smallest memory cell area, and the amount of charge contained in a signal from a sense amplifier is also largely increased. Furthermore, by superposing two or more memory blocks, the planar area occupied by a memory block is further reduced, and the degree of integration can be further increased. Consequently, a higher degree of integration for a ferroelectric memory device becomes possible. This is quite useful in practice.

What is claimed is:

1. A semiconductor memory device comprising:
   a MIS transistor for selecting a memory cell;
   a common node electrode electrically connected with an impurity diffusing region of the MIS transistor;
   a bit line electrically connected with another impurity diffusing region of the MIS transistor; and
   a plurality of storage means connected to the common node electrode, wherein each said storage means includes a plurality of capacitors electrically connected with each other in parallel.

2. A semiconductor memory device as set forth in claim 1, wherein said a plurality of storage means are formed by stacking a plurality of capacitor layers each including said common node electrode, a plate electrode layer having a plurality of plate electrodes each facing the common node electrode, and a dielectric film between the common node electrode and the plate electrode layer, where in two adjacent capacitor layers, the common node electrode, the dielectric film, and the plate electrode layer are arranged in reverse order.

3. A semiconductor memory device as set forth in claim 2, wherein said two adjacent capacitor layers share the same common node electrode or the same plate electrode layer.

4. A semiconductor memory device as set forth in claim 3, wherein said plate electrodes in different capacitor layers included in each said storage means are connected with each other, and said common node electrodes in different capacitor layers are connected with each other.

5. A semiconductor memory device comprising a plurality of memory cell blocks each including a MIS transistor for selecting a memory cell;

a common node electrode electrically connected with an impurity diffusing region of the MIS transistor;

a bit line electrically connected with another impurity diffusing region of the MIS transistor; and a plurality of storage means connected to the common node electrode, wherein each said storage means includes a plurality of capacitors electrically connected with each other in parallel, and said common node electrodes of different memory cell blocks are stacked so as to overlap each other.

6. A semiconductor memory device as set forth in claim 5, wherein each of said plurality of storage means in each said memory cell block is formed by stacking a plurality of capacitor layers each including said common node electrode, a plate electrode layer having a plurality of plate electrodes each facing the common node electrode, and a dielectric film between the common node electrode and the plate electrode layer, and the common node electrode, the dielectric film, and the plate electrode layer are arranged in reverse order in two adjacent capacitor layers.

7. A semiconductor memory device as set forth in claim 6, wherein said two adjacent capacitor layers share the same common node electrode or the same plate electrode layer.

8. A semiconductor memory device as set forth in claim 7, wherein said plate electrodes in different capacitor layers included in each said storage means are connected with each other, and said common node electrodes in different said capacitor layers are connected with each other.

* * * * *